(12) United States Patent
Hirakata

(10) Patent No.: US 10,139,660 B2
(45) Date of Patent: Nov. 27, 2018

(54) DISPLAY DEVICE AND MANUFACTURING METHOD THEREOF

(71) Applicant: Semiconductor Energy Laboratory Co., Ltd., Atsugi-shi, Kanagawa-ken (JP)

(72) Inventor: Yoshiharu Hirakata, Ebina (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/441,489

(22) Filed: Feb. 24, 2017

(65) Prior Publication Data
US 2017/0227807 A1 Aug. 10, 2017

Related U.S. Application Data

(63) Continuation of application No. 14/468,838, filed on Aug. 26, 2014, now Pat. No. 9,582,043.

(30) Foreign Application Priority Data

Aug. 30, 2013 (JP) .................................. 2013-179069

(51) Int. Cl.
*G02F 1/1333* (2006.01)
*H04M 1/02* (2006.01)
(Continued)

(52) U.S. Cl.
CPC .. *G02F 1/133308* (2013.01); *G02F 1/133305* (2013.01); *G06F 1/1641* (2013.01);
(Continued)

(58) Field of Classification Search
CPC . H04M 1/0214–1/0222; H04M 1/0268; G06F 1/1616; G06F 1/1618; G06F 1/1641; G06F 1/1652; G02F 1/13336
See application file for complete search history.

(56) References Cited

U.S. PATENT DOCUMENTS 6,262,785 B1  7/2001 Kim
6,377,324 B1  4/2002 Katsura
(Continued)

FOREIGN PATENT DOCUMENTS

CN  001495586 A  5/2004
CN  001744803 A  3/2006
(Continued)

OTHER PUBLICATIONS

International Search Report (Application No. PCT/JP2014/072511) dated Dec. 2, 2014.
(Continued)

*Primary Examiner* — Mariceli Santiago
(74) *Attorney, Agent, or Firm* — Robinson Intellectual Property Law Office; Eric J. Robinson

(57) ABSTRACT

A novel foldable display device or an electronic device using the same, e.g., a portable information processor or a portable communication information device, is provided. A foldable display device of which a display panel can be folded n times (n≥1, and n is a natural number) at a curvature radius of greater than or equal to 1 mm and less than or equal to 100 mm is obtained. The display device can be miniaturized by being foldable. In addition, in the state where the flexible display panel is opened, display which is unbroken and continuous over a plurality of housings is possible. The plurality of housings can store a circuit, an electronic component, a battery and the like inside as appropriate, and the thickness of each housing can be small.

15 Claims, 13 Drawing Sheets

(51) Int. Cl.
*G06F 1/16* (2006.01)
*H05K 1/02* (2006.01)

(52) U.S. Cl.
CPC ......... *G06F 1/1652* (2013.01); *H04M 1/0268* (2013.01); *H05K 1/0281* (2013.01); *H05K 2201/10128* (2013.01)

(56) References Cited

U.S. PATENT DOCUMENTS

| | | |
|---|---|---|
| 7,446,757 B2 | 11/2008 | Mochizuki et al. |
| 8,803,816 B2 | 8/2014 | Kilpatrick, II et al. |
| 8,836,611 B2 | 9/2014 | Kilpatrick, II et al. |
| 8,860,632 B2 | 10/2014 | Kilpatrick, II et al. |
| 8,860,765 B2 | 10/2014 | Kilpatrick, II et al. |
| 8,863,038 B2 | 10/2014 | King et al. |
| 8,866,840 B2 | 10/2014 | Dahl et al. |
| 8,933,874 B2 | 1/2015 | Lundqvist et al. |
| 8,947,320 B2 | 2/2015 | King et al. |
| 9,009,984 B2 | 4/2015 | Caskey et al. |
| 2004/0052044 A1 | 3/2004 | Mochizuki et al. |
| 2006/0050169 A1 | 3/2006 | Misawa |
| 2007/0097014 A1 | 5/2007 | Solomon et al. |
| 2010/0064244 A1 | 3/2010 | Kilpatrick, II et al. |
| 2010/0064536 A1 | 3/2010 | Caskey et al. |
| 2010/0066643 A1 | 3/2010 | King et al. |
| 2010/0085382 A1 | 4/2010 | Lundqvist et al. |
| 2011/0134144 A1 | 6/2011 | Moriwaki |
| 2012/0217516 A1 | 8/2012 | Hatano et al. |
| 2012/0307423 A1 | 12/2012 | Bohn et al. |
| 2013/0010405 A1 | 1/2013 | Rothkopf et al. |
| 2013/0100392 A1 | 4/2013 | Fukushima |
| 2013/0120912 A1 | 5/2013 | Ladouceur et al. |

FOREIGN PATENT DOCUMENTS

| | | |
|---|---|---|
| CN | 001960612 A | 5/2007 |
| CN | 102150099 A | 8/2011 |
| EP | 1635313 A | 3/2006 |
| EP | 1785805 A | 5/2007 |
| EP | 3190476 A | 7/2017 |
| JP | 59-156220A U | 10/1984 |
| JP | 03-058108 A | 3/1991 |
| JP | 11-167354 A | 6/1999 |
| JP | 2001-255513 A | 9/2001 |
| JP | 2001-255514 A | 9/2001 |
| JP | 2002-366059 A | 12/2002 |
| JP | 2004-118803 A | 4/2004 |
| JP | 2005-114759 A | 4/2005 |
| JP | 2006-072115 A | 3/2006 |
| JP | 2007-128078 A | 5/2007 |
| JP | 2007-140247 A | 6/2007 |
| JP | 2011-022528 A | 2/2011 |
| JP | 2011-112891 A | 6/2011 |
| JP | 2012-502372 | 1/2012 |
| JP | 2012-190794 A | 10/2012 |
| KR | 2006-0050636 A | 5/2006 |
| TW | 477924 | 3/2002 |
| TW | I235905 | 7/2005 |
| TW | 200717420 | 5/2007 |
| WO | WO-1999/034348 | 7/1999 |
| WO | WO-2007/000719 | 1/2007 |
| WO | WO-2010/028394 | 3/2010 |
| WO | WO-2010/028397 | 3/2010 |
| WO | WO-2010/028399 | 3/2010 |
| WO | WO-2010/028402 | 3/2010 |
| WO | WO-2010/028403 | 3/2010 |
| WO | WO-2010/028404 | 3/2010 |
| WO | WO-2010/028405 | 3/2010 |
| WO | WO-2010/028406 | 3/2010 |
| WO | WO-2010/028407 | 3/2010 |
| WO | WO-2012/002272 | 1/2012 |

OTHER PUBLICATIONS

Written Opinion (Application No. PCT/JP2014/072511) dated Dec. 2, 2014.
Taiwanese Office Action (Application No. 103129545) dated Nov. 23, 2017.
Chinese Office Action (Application No. 201480047640.6) dated Feb. 9, 2018.

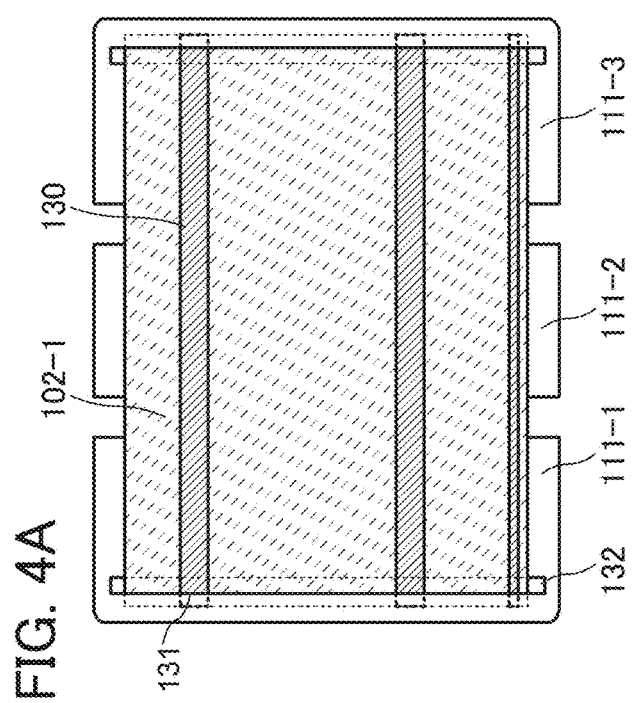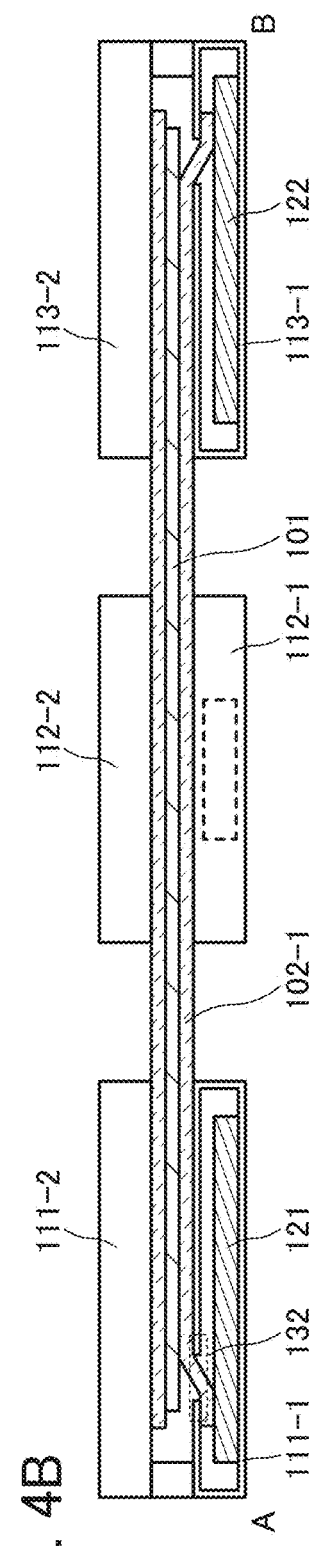

DISPLAY DEVICE AND MANUFACTURING METHOD THEREOF

TECHNICAL FIELD

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a lighting device, driving methods thereof, or manufacturing methods thereof. In particular, one embodiment of the present invention relates to an electronic device, an information processor, and a communication information device, each of which has a display device, or manufacturing methods thereof.

BACKGROUND ART

The social infrastructures relating to means for transmitting information have advanced. This has made it possible to acquire, process, and send out many pieces and various kinds of information with the use of an information processor not only at home or office but also at other visiting places.

Under the circumstance, portable information processors such as a smartphone, a tablet, and a phablet are under active development. For example, an electronic device using a flexible display panel has been known (Patent Document 1). In addition, a multi-panel electronic device has been known (Patent Document 2).

PATENT DOCUMENT

[Patent Document 1] Japanese Published Patent Application No. 2012-190794
[Patent Document 2] Japanese Published Patent Application No. 2012-502372

DISCLOSURE OF INVENTION

An object of one embodiment of the present invention is to provide a novel foldable display device or an electronic device using such a display device, e.g., a portable information processor or a portable communication information device. Another object of one embodiment of the present invention is to provide a miniaturized display device. Another object of one embodiment of the present invention is to provide a display device capable of unbroken, continuous display. Another object of one embodiment of the present invention is to provide a thinned display device. Another object of one embodiment of the present invention is to provide a novel display device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

In one embodiment, a foldable display device of which a display panel can be folded n times ($n \geq 1$, and n is a natural number) at a curvature radius of greater than or equal to 1 mm and less than or equal to 100 mm is provided.

In one embodiment, a flexible display panel includes a first portion supported by a first housing, a second portion supported by a second housing, and a bend portion between the first portion and the second portion. A first circuit (or electronic component) is provided in the first housing supporting the first portion. A second circuit (or electronic component) is provided in the second housing supporting the second portion. When the flexible display panel is folded (or bent) at the bend portion, the first housing and the second housing overlap with each other. The first circuit (or electronic component) and the second circuit (or electronic component) may have different functions from each other. Alternatively, the first circuit (or electronic component) and the second circuit (or electronic component) may have the same functions.

In one embodiment, a flexible display panel includes first to third portions respectively supported by first to third housings, a first bend portion between the first portion and the second portion, and a second bend portion between the second portion and the third portion. When the flexible display panel is folded, the first to third portions overlap with one another. In that state, any one of the first to third portions appears on the top surface, and a driving mode is possible in which at least display of the portion appearing atop is selectively on and display of the other portions is off. A first circuit (or electronic component) is provided in one housing among the first to third housings respectively supporting the first to third portions, and a second circuit (or electronic component) is provided in another housing among the first to third housings respectively supporting the first to third portions. Furthermore, although a third circuit (or electronic component) may be provided in still another housing, any circuit (or electronic component) need not necessarily be provided in that housing. In the state where the flexible display panel is folded, not only display of the first portion on the top surface but also display of the bend portion connecting to the first portion can be selectively on.

In any of the above embodiments, the first circuit (or electronic component) and the second circuit (or electronic component) may be connected to each other through a wiring. This wiring may be directly provided in or on the flexible display panel. Alternatively, this wiring may be provided in a flexible substrate or sheet that is provided to overlap with the flexible display panel. Further alternatively, the first circuit (or electronic component) and the second circuit (or electronic component) may communicate signals wirelessly.

The display device can be miniaturized by being foldable. In addition, in the state where the flexible display panel is opened, display which is unbroken and continuous over a plurality of housings is possible. The plurality of housings can store a circuit, an electronic component, a battery and the like inside as appropriate, and the thickness of each housing can be small. Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF DRAWINGS

In the accompanying drawings:
FIGS. 4A and 4B illustrate a display device.

BEST MODE FOR CARRYING OUT THE INVENTION

Figure 1A:
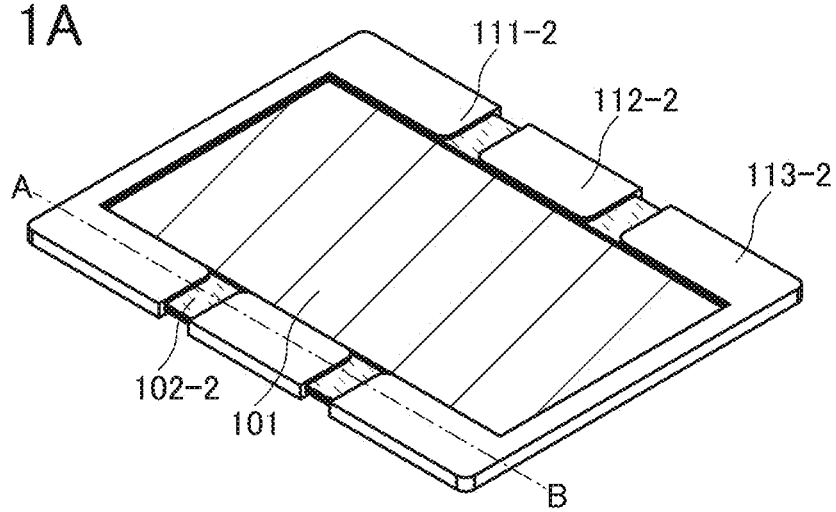
FIGS. 1A to 1C illustrate a display device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention is not interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, a structure of a display device of one embodiment of the present invention will be described with reference to FIGS. 1A to 1C, FIG. 2, and FIGS. 3A and 3B. In this embodiment, a display device that can be folded in three, in other words, a display device having two bend portions, will be described. Note that one embodiment of the present invention need not be limited to a display device folded in three, and a display device folded in two, four, five, or more is possible. In addition, a way of folding a display panel is not limited to the embodiment. For example, a display panel can be folded such that not the leftmost portion but the rightmost portion becomes the top surface or the center portion becomes the top surface.

Figure 1B:
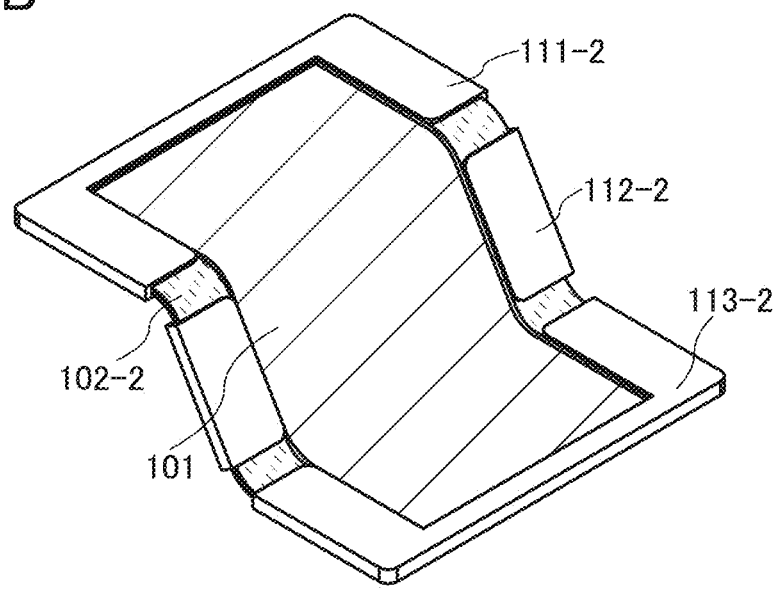
Figure 1C:
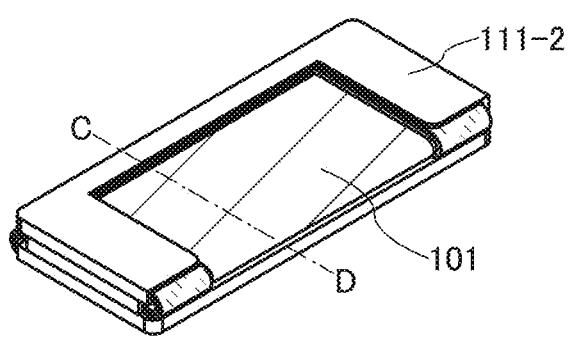
Figure 2:
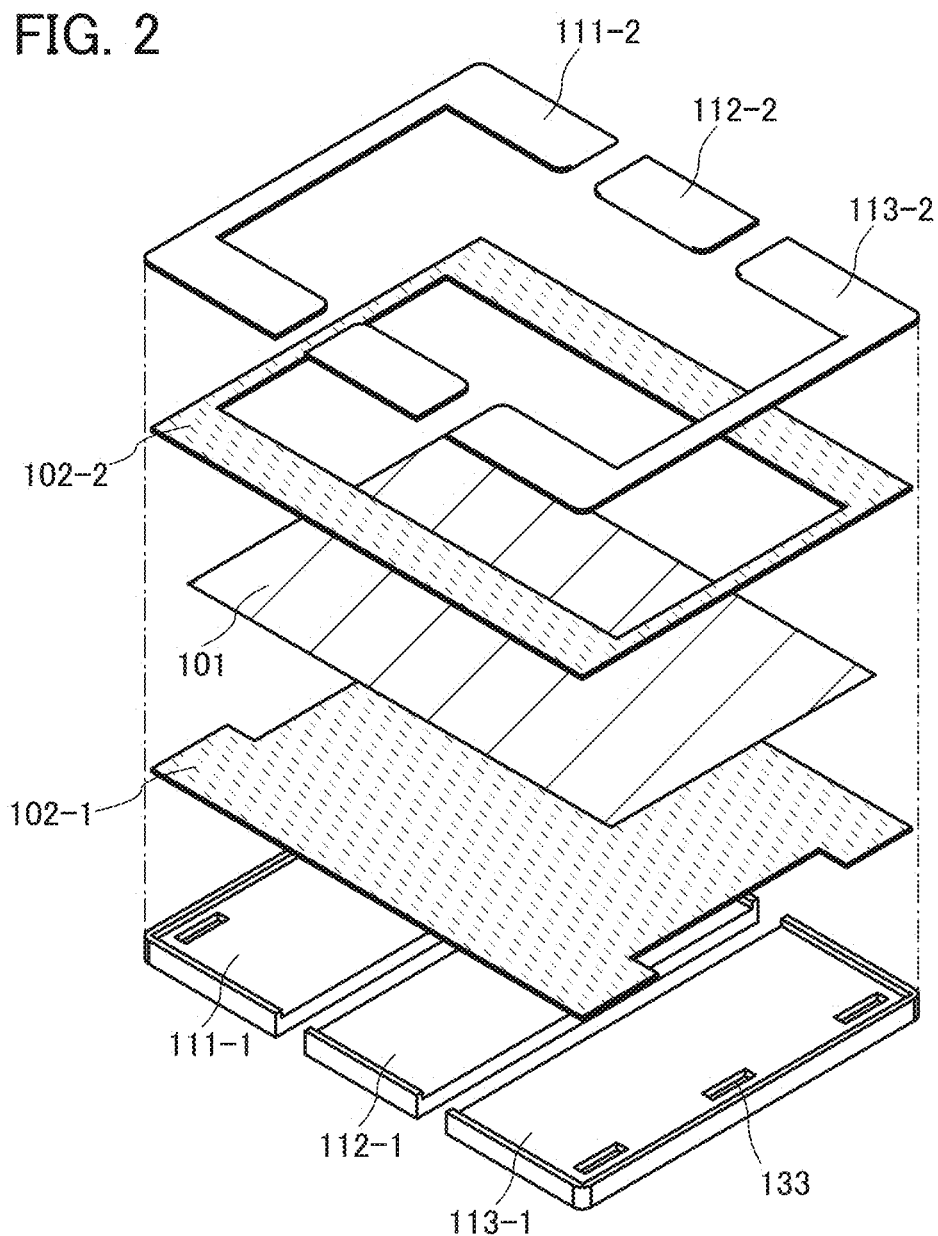
FIG. 2 illustrates a display device.
Figure 3A:
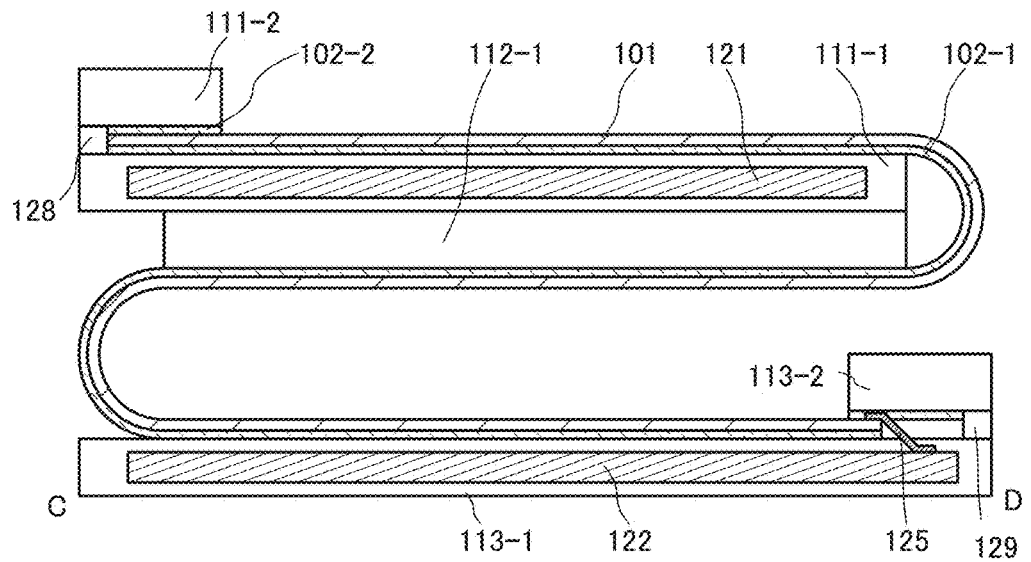
FIGS. 3A and 3B illustrate a display device.
Figure 3B:
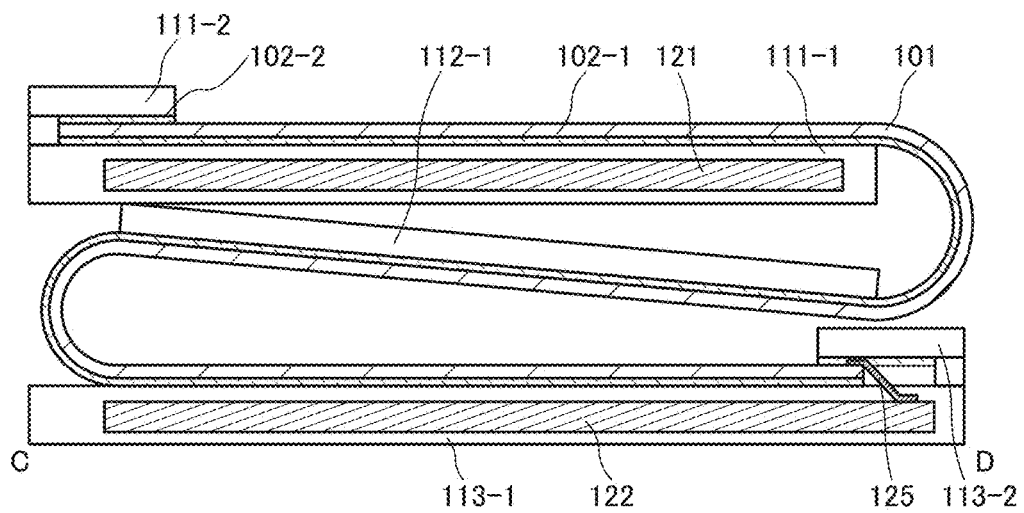

FIG. 1A to 1C are conceptual diagrams of a display device of this embodiment. FIG. 1A shows a state where a flexible display panel is opened. FIG. 1B shows a state where the flexible display panel that is being opened or being folded. FIG. 1C shows a state where the flexible display panel is folded. In each of FIG. 1A to 1C, the display surface faces upside. FIG. 2 shows the display device in a state where the display panel is opened. FIGS. 3A and 3B show cross-sectional views taken along dashed-dotted line C-D in FIG. 1C, which are in a state where the flexible panel is folded (hereinafter such state may also be referred to as close state).

A component such as a switch (not shown) for detecting an open/close state of the display panel may be provided in at least one of housings.

In FIG. 3A, which is in a state where the display panel is folded, the following driving may be performed: a region of the top surface of the display panel and a region of the side surface of the display panel connecting to the top surface region (that is, a region on the right side of the top surface display region) is selectively used as a display region and the other portions are not used as a display region. In this way, unnecessary power consumption can be prevented in the state where the display panel is folded.

Housings (or frames) 111-1, 112-1, and 113-1 supporting the display panel are provided on an underside (rear side) of a flexible display panel 101. These housings can store a circuit, an electronic component, a battery and the like inside. The housings may be formed using a metal, a resin, a rubber, or a combination thereof to have a function of protecting the display panel, or a circuit or an electronic component stored inside, from the impact of hitting or drop.

Frame members 111-2, 112-2, and 113-2 are provided on an upper side (display surface side) of a periphery of the flexible display panel 101. The flexible display panel is sandwiched between the housings on the underside and the corresponding frame members on the upper side, thereby being supported. The material of the frame members may be the same as the material of the housings.

Each of the frame members and the corresponding housing may be fixed to each other by means of an adhesive, a screw, or the like. Alternatively, each of the frame members and the corresponding housing may be formed as one component using the same material. In that case, such a component may have a groove in which the display panel is set, thereby holding the display panel. In this embodiment, side frame members 128 and 129 are provided. The side frame members may be formed using a material such as a metal, a resin, or a rubber.

The curvature radius at the bend portion may be greater than or equal to 1 mm and less than or equal to 100 mm.

A circuit or electronic component (121 or 122) such as a control unit, a power supply unit, a storage battery, or an antenna is stored in at least one of the housings 111-1, 112-1, and 113-1. An FPC (flexible printed circuit substrate) 125 may be used for the connection between the circuit or electronic component and the display panel.

The housings 111-1, 112-1, and 113-1 may be directly fixed to the display panel with an adhesive or the like. Alternatively, a flexible substrate that protects the display panel or has a function of leading a wiring may be provided between the display panel and the housings.

In this embodiment, an example in which a flexible substrate 102-1 is provided between the display panel and the housings is shown. The flexible substrate 102-1 has approximately the same size as the display panel, and has also a function of connecting the housings. In order to connect the FPC extending from the display panel with the housing, part of the flexible substrate may be cut off or the size of the flexible substrate may be a little smaller than the display panel. The material of the flexible substrate 102-1 may be a resin, a rubber or the like, in which case the mechanical strength of the bend portion can be supplemented. Furthermore, a wiring for connecting the circuits or electronic components provided in the housings is provided in the flexible substrate 102-1.

A flexible substrate 102-2 may be provided between the display panel and the frame members on the upper side. General FPC substrates may be used as the flexible substrates 102-1 and 102-2. Note that both of or either one of the flexible substrates 102-1 and 102-2 may be omitted.

The FPC 125 is provided on the flexible display panel 101, and is connected to a driver circuit of the display panel or the like, which is provided in the housing. Although not limited to this, the FPC 125 may be connected to the driver circuit provided in the housing through an opening 133 of the housing.

FIG. 3B shows a modification example of this embodiment, in which a housing 112-1 is thinner than housings 111-1 and 113-1. This embodiment can be combined with any of the other embodiments in this specification as appropriate.

Embodiment 2

In this embodiment, configurations of display devices each of which is one embodiment of the present invention will be described with reference to FIGS. 4A and 4B and FIGS. 5A and 5B. Note that some components similar to those of the display device described in Embodiment 1 can also be used in this embodiment. For such components, the description in Embodiment 1 is referred to.

In this embodiment, as an example, a battery unit 121 is stored in a housing 111-1, and a main substrate including a control unit for controlling a display panel and an electronic device as a whole is stored in a housing 113-1. A housing 112-1 may be a dummy housing that does not store any circuit or electronic component. Storing a plurality of components in a plurality of different housings, as in this embodiment, can make the thicknesses of the housings evenly thin. In this embodiment, the thicknesses of all the housings are the same, in which case a display surface can easily be flat when the display panel is opened.

Wirings (including a line leading power supply, in this embodiment) are provided in a flexible substrate 102-1, and power is supplied from the battery unit 121 in the housing 111-1 to the control unit 122 in the housing 113-1. An example of the flexible substrate 102-1 in which the wirings are provided is shown in FIGS. 4A and 4B. In FIG. 4A, a reference numeral 130 denotes a wiring and a reference numeral 131 denotes a terminal portion. The wiring 130 is connected to the battery or the control unit stored in the housing through an opening 132 of the housing. Note that a display panel on the upper side of the flexible substrate 102-1 and components thereover are not shown in FIG. 4A for explanation. Although an example in which one long opening extends is shown in FIG. 4A, the shape and the number of openings are not limited thereto. A plurality of openings may be provided as shown in FIG. 2.

Figure 5A:
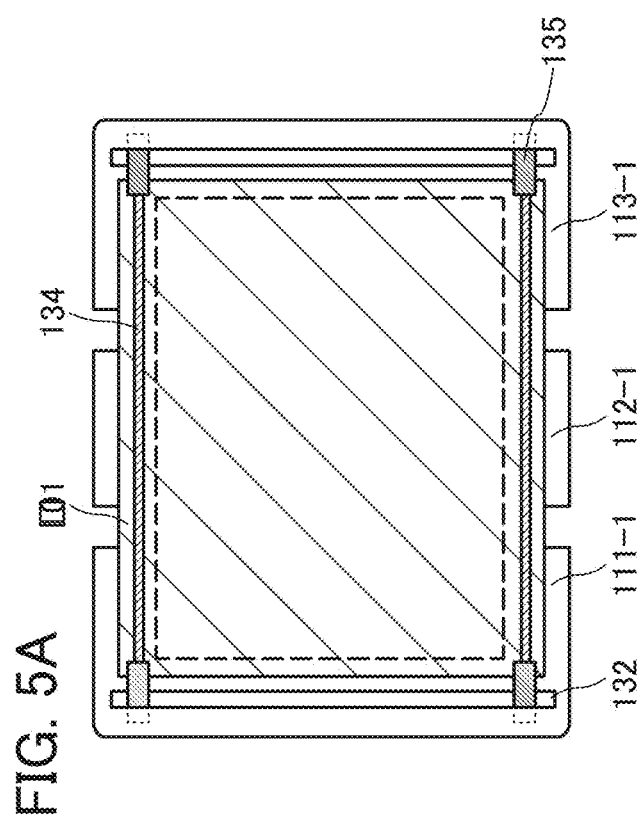
FIGS. 5A and 5B illustrate a display device.
Figure 5B:
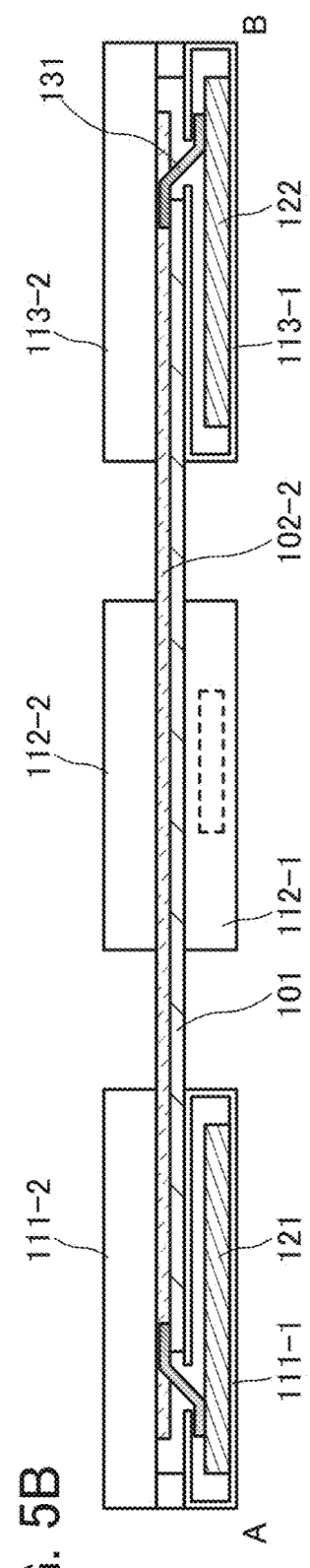

FIGS. 5A and 5B show a modification example of FIGS. 4A and 4B, in which the flexible substrate 102-1 is omitted and a wiring 134 is directly provided in or on a flexible display panel 101. For example, the wiring 134 may be formed on the same substrate as the display panel with the use of a wiring layer constituting gate electrodes or source/drain electrodes of transistors included in the display panel and/or some other wiring layers formed on the same substrate as the transistors, and may be connected to a circuit in a housing by an FPC 135. As another modification example, a battery unit can be stored in each of the housing 112-1 and the housing 111-1 in FIGS. 4A and 4B and FIGS. 5A and 5B. In such a case, the display device can be used for a longer period of time even without charging a storage battery.

This embodiment can be combined with any of the other embodiments in this specification as appropriate.

Embodiment 3

Figure 6:
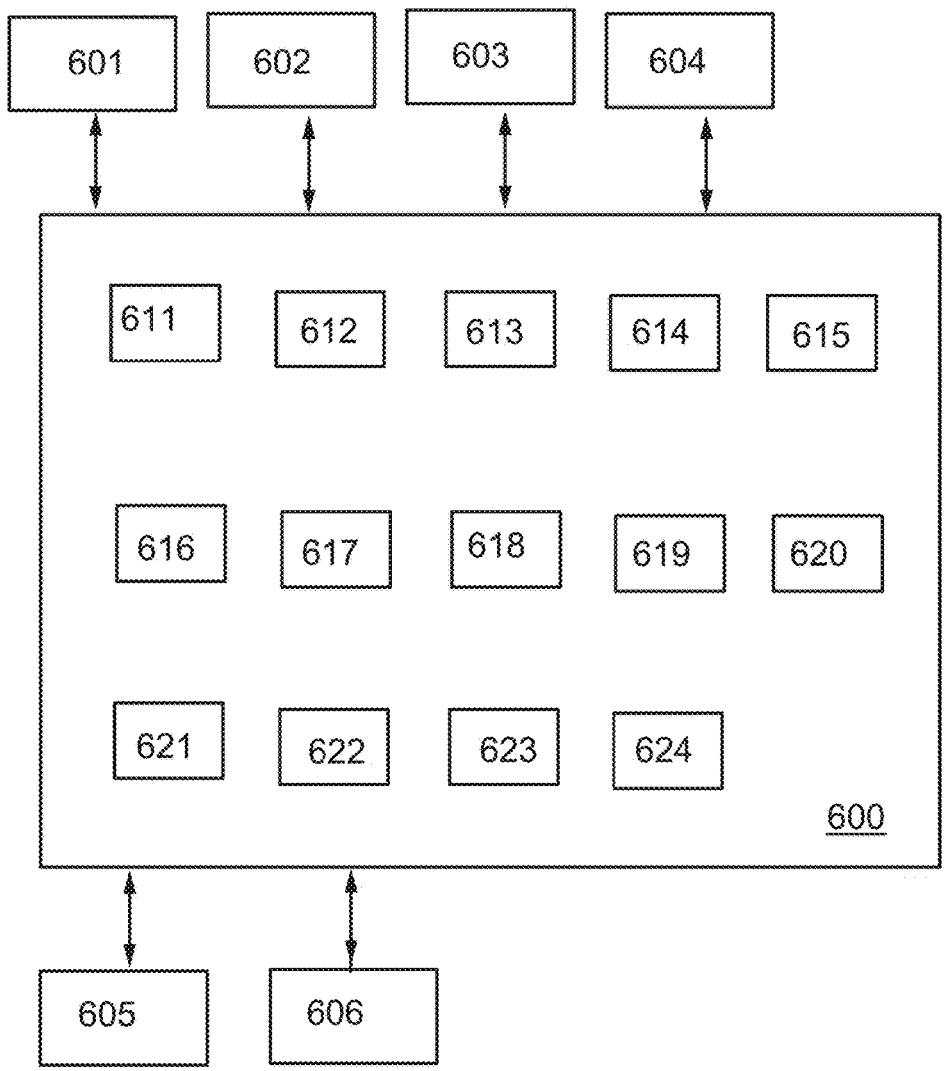
FIG. 6 illustrates a smartphone.

In this embodiment, an example of a portable communication device such as a smartphone (mobile phone with advanced features), a tablet with a telephone function, or a phablet will be described. FIG. 6 shows a general configuration of a smartphone. In general, the smartphone includes a main substrate 600, a speaker 601, a camera 602, a display panel 603, a battery unit 604, an antenna for portable communication 605, an antenna for NFC 606, and the like. On the main substrate 600, various ICs and electronic components such as a passive element are mounted. For example, a quartz crystal unit 611, a DRAM 612, an application processor 613, a baseband processor 614, an electronic compass 615, a quartz crystal unit 616, an RF transceiver IC 617, a touch panel control IC 618, an acceleration sensor 619, a wireless LAN/Bluetooth (registered trademark) module 620, a power supply control IC 621, a power amplifier for W-CDMA 622, a flash memory 623, a filter 624, and the like are mounted. For the sake of convenience, these components are hereinafter collectively called control unit. Note that not all of these circuits or electronic components need to be mounted on the main substrate, and some of components or circuits may be mounted on a different substrate as appropriate. The display panel is flexible and can be folded.

The main substrate and various electronic components are stored in a plurality of different housings as appropriate. In the display device of Embodiment 2, as an example, the battery unit 604 and the antenna for NFC 606 are stored in the housing 113-1, and the main substrate 600 and the antenna for portable communication 605 are stored in the housing 111-1. In this way, the housing where the battery unit 604 is stored has room for increasing the capacity of a secondary battery. Although there is no need to limit the way the camera 602 is used, it can be used in the following way: the camera is mounted on the housing 113-1 and when the display device is in a close state, a user takes a picture with the camera while seeing an object to be pictured, which is displayed on the display panel over the housing 111-1, the display panel on the opposite side of the display device from the camera.

Embodiment 4

In this embodiment, a display panel using an active matrix electroluminescence (EL) display device will be described as an example of a flexible display panel of one embodiment of the present invention, with reference to FIGS. 7A and 7B, FIGS. 8A and 8B, FIGS. 9A and 9B, FIGS. 10A and 10B, FIGS. 1A to 11C, and FIGS. 12A to 12C. Note that the display panel is not limited to an EL display device, and other kinds of display devices such as a liquid crystal display device and an electrophoretic display device may also be used.

Specific Example 1

Figure 7A:
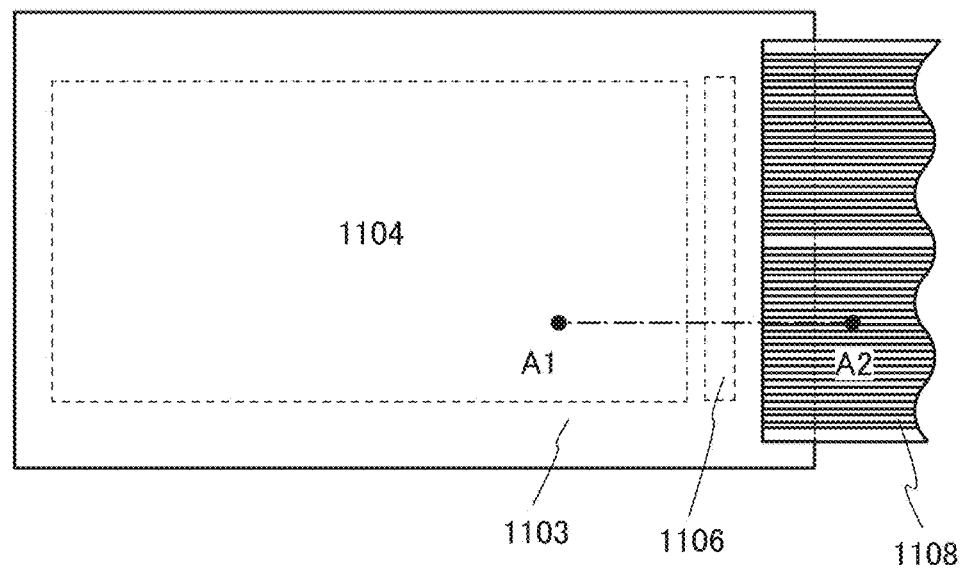
FIGS. 7A and 7B illustrate a display panel.
Figure 7B:
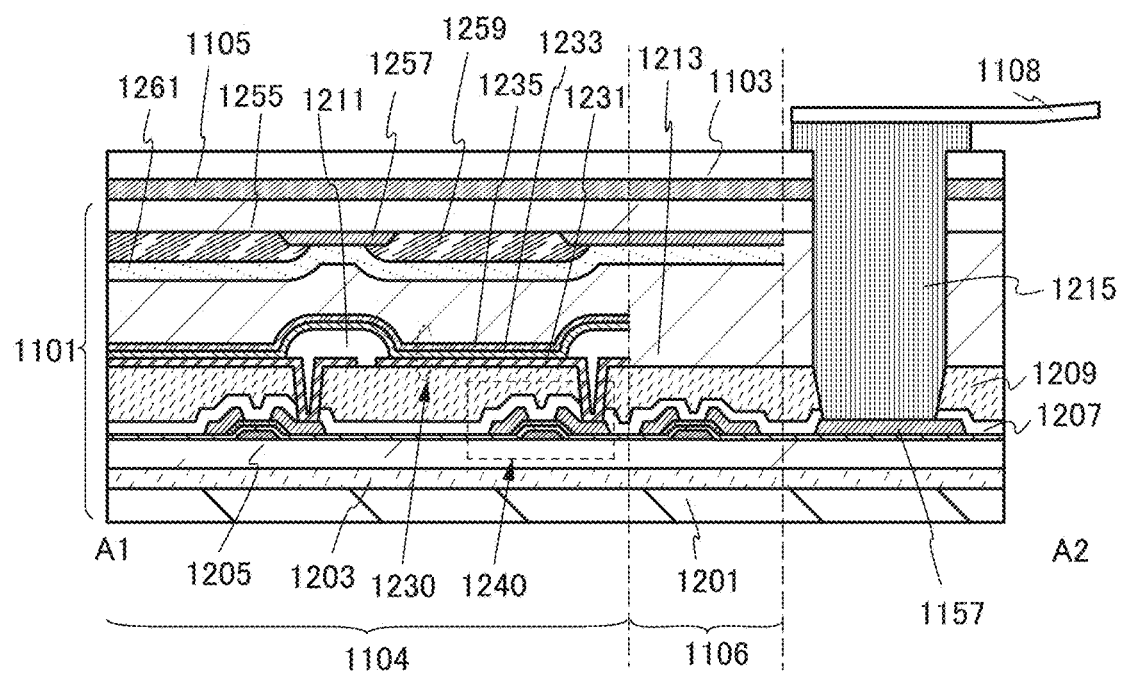

FIG. 7A shows a plan view of a flexible display panel 101, and FIG. 7B shows an example of a cross-sectional view taken along dashed-dotted line A1-A2 in FIG. 7A.

The display panel shown in FIG. 7B includes an element layer 1101, a bonding layer 1105, and a substrate 1103. The element layer 1101 includes a substrate 1201, a bonding layer 1203, an insulating layer 1205, a plurality of transistors 1240, a conductive layer 1157, an insulating layer 1207, an insulating layer 1209, a plurality of light-emitting elements 1230, an insulating layer 1211, a sealing layer 1213, an insulating layer 1261, a coloring layer 1259, a light-blocking layer 1257, and an insulating layer 1255.

The conductive layer 1157 is electrically connected to an FPC 1108 via a connector 1215.

A light-emitting element 1230 includes a lower electrode 1231, an EL layer 1233, and an upper electrode 1235. The EL layer is formed of an organic light-emitting material. The lower electrode 1231 is electrically connected to a source electrode or a drain electrode of the transistor 1240. An end portion of the lower electrode 1231 is covered with the insulating layer 1211. The light-emitting element 1230 has a top emission structure. The upper electrode 1235 has a light-transmitting property and transmits light emitted from the EL layer 1233.

The coloring layer 1259 is provided to overlap with the light-emitting element 1230, and the light-blocking layer 1257 is provided to overlap with the insulating layer 1211.

The coloring layer 1259 and the light-blocking layer 1257 are covered with the insulating layer 1261. The space between the light-emitting element 1230 and the insulating layer 1261 is filled with the sealing layer 1213.

The display panel includes a plurality of transistors in a light extraction portion 1104 and a driver circuit portion 1106. The transistor 1240 is provided over the insulating layer 1205. The insulating layer 1205 and the substrate 1201 are attached to each other with the bonding layer 1203. The insulating layer 1255 and the substrate 1103 are attached to each other with the bonding layer 1105. It is preferable to use films with low water permeability for the insulating layer 1205 and the insulating layer 1255, in which case an impurity such as water can be prevented from entering the light-emitting element 1230 or the transistor 1240, leading to improved reliability of the display panel. The bonding layer 1203 can be formed using a material similar to that of the bonding layer 1105.

The display panel in Specific Example 1 can be manufactured in the following manner: the insulating layer 1205, the transistor 1240, and the light-emitting element 1230 are formed over a formation substrate with high heat resistance; the formation substrate is detached; and the insulating layer 1205, the transistor 1240, and the light-emitting element 1230 are transferred to the substrate 1201 and attached thereto with the use of the bonding layer 1203. Furthermore, the display panel in Specific Example 1 can be manufactured in the following manner: the insulating layer 1255, the coloring layer 1259, and the light-blocking layer 1257 are formed over a formation substrate with high heat resistance; the formation substrate is detached; and the insulating layer 1255, the coloring layer 1259, and the light-blocking layer 1257 are transferred to the substrate 1103 and attached thereto with the use of the bonding layer 1105.

In the case where a material with high water permeability and low heat resistance (e.g., resin) is used for a substrate, it is impossible to expose the substrate to high temperature in the manufacturing process. Thus, there is a limitation on conditions for forming a transistor and an insulating film over the substrate. In the manufacturing method of this embodiment, a transistor and the like can be formed over a formation substrate with high heat resistance; thus, a highly reliable transistor and an insulating film with sufficiently low water permeability can be formed. Then, the transistor and the insulating film are transferred to the substrate 1103 and the substrate 1201, whereby a highly reliable display panel can be manufactured. Therefore, with one embodiment of the present invention, a thin or/and lightweight active matrix light-emitting device with high reliability can be provided. Details of the manufacturing method thereof will be described later.

The substrate 1103 and the substrate 1201 are each preferably formed using a material with high toughness. In that case, a display device with high impact resistance that is less likely to be broken can be provided. For example, when the substrate 1103 is an organic resin substrate and the substrate 1201 is a substrate formed using a thin metal material or a thin alloy material, the display panel can be lightweight and less likely to be broken, as compared with the case where a glass substrate is used.

A metal material and an alloy material, which have high thermal conductivity, are preferred because they can easily conduct heat to the whole substrate and accordingly can prevent a local temperature rise in the display panel. The thickness of a substrate using a metal material or an alloy material is preferably greater than or equal to 10 μm and less than or equal to 200 μm, further preferably greater than or equal to 20 μm and less than or equal to 50 μm.

Furthermore, when a material with high thermal emissivity is used for the substrate 1201, the surface temperature of the display panel can be prevented from rising, leading to prevention of breakage or a decrease in reliability of the display panel. For example, the substrate 1201 may have a stacked structure of a metal substrate and a layer with high thermal emissivity (the layer can be formed using a metal oxide or a ceramic material, for example). In the following specific examples, description of components similar to those in Specific Example 1 is omitted.

Specific Example 2

Figure 8A:
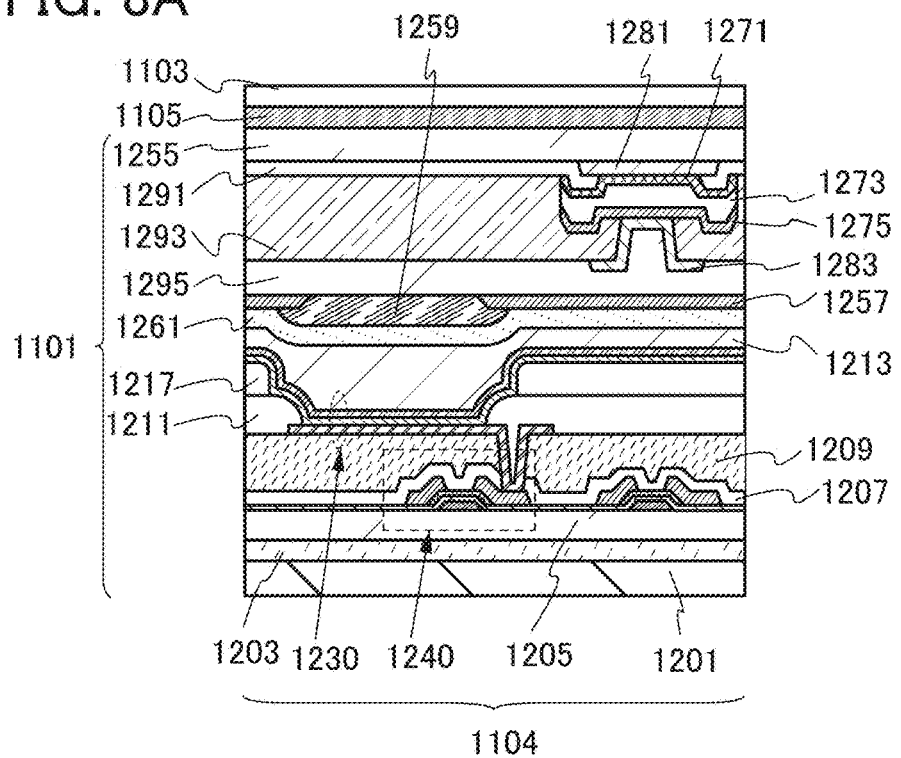
FIGS. 8A and 8B illustrate a display panel.

FIG. 8A shows another example of a light extraction portion 1104 in a display panel. The display panel shown in FIG. 8A is capable of touch operation.

The display panel shown in FIG. 8A includes an element layer 1101, a bonding layer 1105, and a substrate 1103. The element layer 1101 includes a substrate 1201, a bonding layer 1203, an insulating layer 1205, a plurality of transistors, an insulating layer 1207, an insulating layer 1209, a plurality of light-emitting elements, an insulating layer 1211, an insulating layer 1217, a sealing layer 1213, an insulating layer 1261, a coloring layer 1259, a light-blocking layer 1257, a plurality of light-receiving elements, a conductive layer 1281, a conductive layer 1283, an insulating layer 1291, an insulating layer 1293, an insulating layer 1295, and an insulating layer 1255.

In Specific Example 2, the insulating layer 1217 is provided over the insulating layer 1211. With the provision of the insulating layer 1217, the space between the substrate 1103 and the substrate 1201 can be adjusted.

FIG. 8A shows an example in which the light-receiving element is provided between the insulating layer 1255 and the sealing layer 1213. Since the light-receiving element can be placed to overlap with a non-light-emitting region (e.g., a region where a transistor 1240 or a wiring is provided) on the substrate 1201 side, the display panel can be provided with a touch sensor without a decrease in the aperture ratio of a pixel (light-emitting element).

As the light-receiving element included in the display panel, for example, a PN photodiode or a PIN photodiode can be used. In this embodiment, a PIN photodiode including a p-type semiconductor layer 1271, an i-type semiconductor layer 1273, and an n-type semiconductor layer 1275 is used as the light-receiving element.

Note that the i-type semiconductor layer 1273 is a semiconductor in which the concentration of each of an impurity imparting p-type conductivity and an impurity imparting n-type conductivity is $1\times10^{20}$ cm$^{-3}$ or less and which has photoconductivity 100 times or more as high as dark conductivity. The i-type semiconductor layer 1273 also includes, in its category, a semiconductor that contains an impurity element belonging to Group 13 or Group 15 of the periodic table. In other words, since an i-type semiconductor has weak n-type electric conductivity when an impurity element for controlling valence electrons is not added intentionally, the i-type semiconductor layer 1273 includes, in its category, a semiconductor to which an impurity element imparting p-type conductivity is added intentionally or unintentionally at the time of deposition or after the deposition.

The light-blocking layer 1257 is overlapped with the light-receiving element on the substrate 1103 side. The light-blocking layer 1257 between the light-receiving element and the sealing layer 1213 can prevent the light-receiving element from being irradiated with light emitted from the light-emitting element 1230.

Each of the conductive layer 1281 and the conductive layer 1283 is electrically connected to the light-receiving element. For the conductive layer 1281, a conductive layer that transmits light incident on the light-receiving element is preferably used. For the conductive layer 1283, a conductive layer that blocks light incident on the light-receiving element is preferably used.

It is preferable to provide an optical touch sensor between the substrate 1103 and the sealing layer 1213 because the optical touch sensor is less likely to be affected by light emitted from the light-emitting element 1230 and can have improved S/N ratio.

Specific Example 3

Figure 8B:
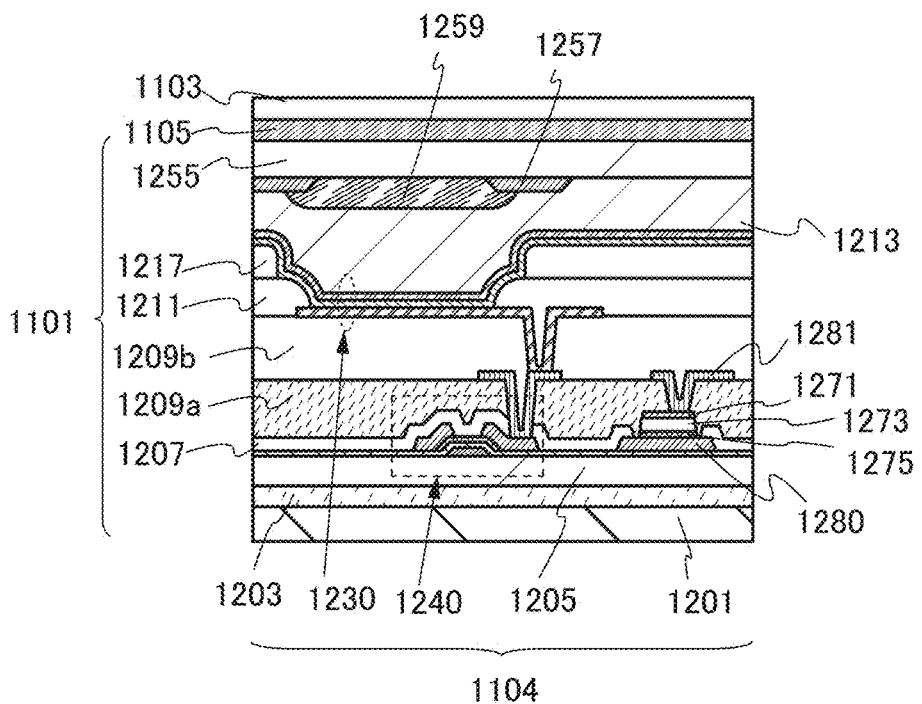

FIG. 8B shows another example of a light extraction portion 1104 in a display panel. The display panel shown in FIG. 8B is capable of touch operation.

The display panel shown in FIG. 8B includes an element layer 1101, a bonding layer 1105, and a substrate 1103. The element layer 1101 includes a substrate 1201, a bonding layer 1203, an insulating layer 1205, a plurality of transistors, an insulating layer 1207, an insulating layer 1209a, an insulating layer 1209b, a plurality of light-emitting elements, an insulating layer 1211, an insulating layer 1217, a sealing layer 1213, a coloring layer 1259, a light-blocking layer 1257, a plurality of light-receiving elements, a conductive layer 1280, a conductive layer 1281, and an insulating layer 1255.

FIG. 8B shows an example in which a light-receiving element is provided between the insulating layer 1205 and the sealing layer 1213. Since the light-receiving element is provided between the insulating layer 1205 and the sealing layer 1213, a conductive layer to which the light-receiving element is electrically connected and a photoelectric conversion layer included in the light-receiving element can be formed using the same materials through the same steps as a conductive layer and a semiconductor layer included in a transistor 1240. Thus, the display panel capable of touch operation can be manufactured without a significant increase in the number of manufacturing steps.

Specific Example 4

Figure 9A:
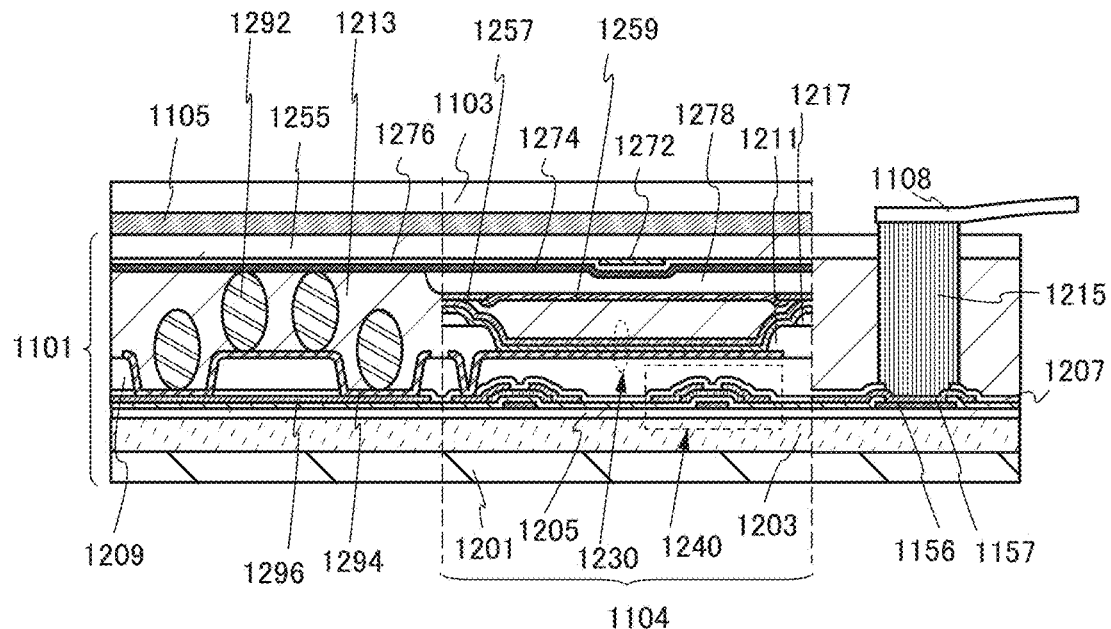
FIGS. 9A and 9B illustrate a display panel.

FIG. 9A shows another example of a display panel. The display panel shown in FIG. 9A is capable of touch operation.

The display panel shown in FIG. 9A includes an element layer 1101, a bonding layer 1105, and a substrate 1103. The element layer 1101 includes a substrate 1201, a bonding layer 1203, an insulating layer 1205, a plurality of transistors, a conductive layer 1156, a conductive layer 1157, an insulating layer 1207, an insulating layer 1209, a plurality of light-emitting elements, an insulating layer 1211, an insulating layer 1217, a sealing layer 1213, a coloring layer 1259, a light-blocking layer 1257, an insulating layer 1255, a conductive layer 1272, a conductive layer 1274, an insulating layer 1276, an insulating layer 1278, a conductive layer 1294, and a conductive layer 1296.

FIG. 9A shows an example in which a capacitive touch sensor is provided between the insulating layer 1255 and the sealing layer 1213. The capacitive touch sensor includes the conductive layer 1272 and the conductive layer 1274.

The conductive layer 1156 and the conductive layer 1157 are electrically connected to an FPC 1108 via a connector 1215. The conductive layer 1294 and the conductive layer 1296 are electrically connected to the conductive layer 1274 via conductive particles 1292. Thus, the capacitive touch sensor can be driven via the FPC 1108.

Specific Example 5

Figure 9B:
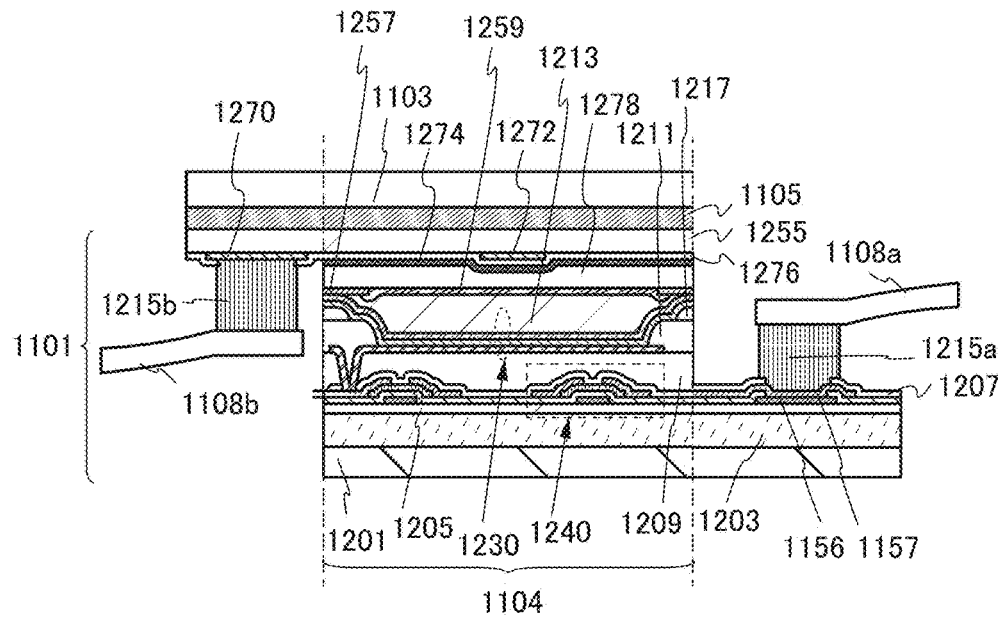

FIG. 9B shows another example of a display panel. The display panel shown in FIG. 9B is capable of touch operation.

The display panel shown in FIG. 9B includes an element layer 1101, a bonding layer 1105, and a substrate 1103. The element layer 1101 includes a substrate 1201, a bonding layer 1203, an insulating layer 1205, a plurality of transistors, a conductive layer 1156, a conductive layer 1157, an insulating layer 1207, an insulating layer 1209, a plurality of light-emitting elements, an insulating layer 1211, an insulating layer 1217, a sealing layer 1213, a coloring layer 1259, a light-blocking layer 1257, an insulating layer 1255, a conductive layer 1270, a conductive layer 1272, a conductive layer 1274, an insulating layer 1276, and an insulating layer 1278.

FIG. 9B shows an example in which a capacitive touch sensor is provided between the insulating layer 1255 and the sealing layer 1213. The capacitive touch sensor includes the conductive layer 1272 and the conductive layer 1274.

The conductive layer 1156 and the conductive layer 1157 are electrically connected to an FPC 1108a via a connector 1215a. The conductive layer 1270 is electrically connected to an FPC 1108b via a connector 1215b. Thus, a light-emitting element 1230 and a transistor 1240 can be driven via the FPC 1108a, and the capacitive touch sensor can be driven via the FPC 1108b.

Specific Example 6

Figure 10A:
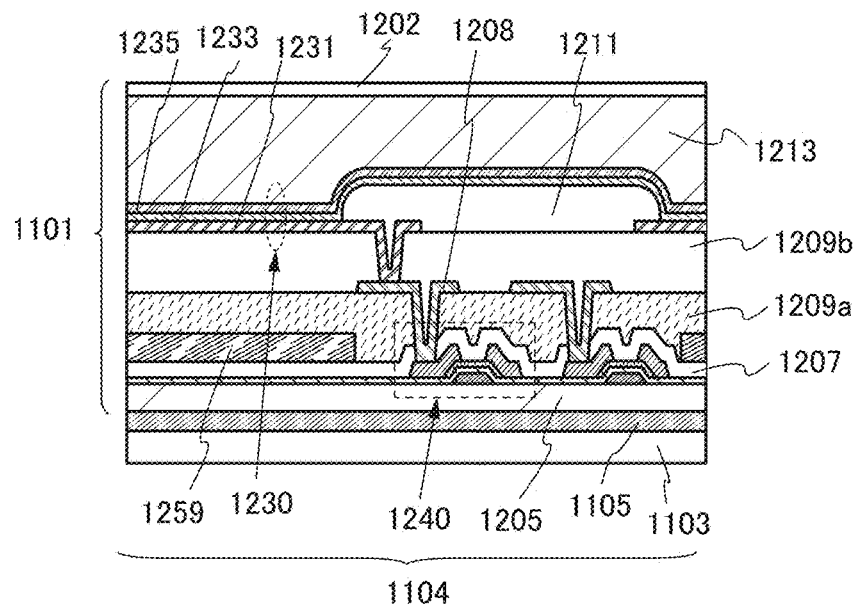
FIGS. 10A and 10B illustrate a display panel.

FIG. 10A shows another example of a light extraction portion 1104 in a display panel.

The light extraction portion 1104 in FIG. 10A includes a substrate 1103, a bonding layer 1105, a substrate 1202, an insulating layer 1205, a plurality of transistors, an insulating layer 1207, a conductive layer 1208, an insulating layer 1209a, an insulating layer 1209b, a plurality of light-emitting elements, an insulating layer 1211, a sealing layer 1213, and a coloring layer 1259.

A light-emitting element 1230 includes a lower electrode 1231, an EL layer 1233, and an upper electrode 1235. The lower electrode 1231 is electrically connected to a source electrode or a drain electrode of a transistor 1240 via the conductive layer 1208. An end portion of the lower electrode 1231 is covered with the insulating layer 1211. The light-emitting element 1230 has a bottom emission structure. The lower electrode 1231 has a light-transmitting property and transmits light emitted from the EL layer 1233.

A coloring layer 1259 is provided in a place overlapped with the light-emitting element 1230, and light emitted from the light-emitting element 1230 is extracted from the substrate 1103 side through the coloring layer 1259. The space between the light-emitting element 1230 and the substrate 1202 is filled with the sealing layer 1213. The substrate 1202 can be formed using a material similar to that of the substrate 1201.

Specific Example 7

Figure 10B:
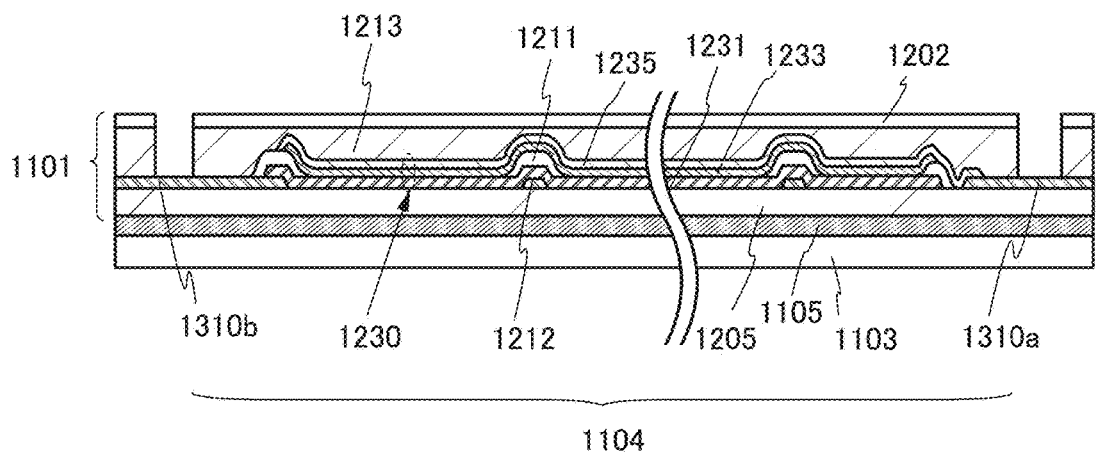

FIG. 10B shows another example of a display panel.

The display panel shown in FIG. 10B includes an element layer 1101, a bonding layer 1105, and a substrate 1103. The element layer 1101 includes a substrate 1202, an insulating layer 1205, a conductive layer 1310a, a conductive layer 1310b, a plurality of light-emitting elements, an insulating layer 1211, a conductive layer 1212, and a sealing layer 1213.

The conductive layer 1310a and the conductive layer 1310b, which are external connection electrodes of the display panel, can each be electrically connected to an FPC or the like.

A light-emitting element 1230 includes a lower electrode 1231, an EL layer 1233, and an upper electrode 1235. An end portion of the lower electrode 1231 is covered with the insulating layer 1211. The light-emitting element 1230 has a bottom emission structure. The lower electrode 1231 has a light-transmitting property and transmits light emitted from the EL layer 1233. The conductive layer 1212 is electrically connected to the lower electrode 1231.

The substrate 1103 may have, as a light extraction structure, a hemispherical lens, a micro lens array, a film provided with an uneven surface structure, a light diffusing film, or the like. For example, the substrate 1103 with a light extraction structure can be formed by attaching the above lens or film to a resin substrate with an adhesive or the like having substantially the same refractive index as the substrate or the lens or film.

The conductive layer 1212 is preferably, though not necessarily, provided because voltage drop due to the resistance of the lower electrode 1231 can be prevented. In addition, for a similar purpose, a conductive layer electrically connected to the upper electrode 1235 may be provided over the insulating layer 1211.

The conductive layer 1212 can be a single layer or a stacked layer formed using a material selected from copper, titanium, tantalum, tungsten, molybdenum, chromium, neodymium, scandium, nickel, or aluminum, or an alloy material containing any of these materials as its main component. The thickness of the conductive layer 1212 can be greater than or equal to 0.1 µm and less than or equal to 3 µm, preferably greater than or equal to 0.1 µm and less than or equal to 0.5 µm.

When a paste (e.g., silver paste) is used as a material for the conductive layer electrically connected to the upper electrode 1235, metal particles forming the conductive layer aggregate; therefore, the surface of the conductive layer is rough and has many gaps. Thus, it is difficult for the EL layer 1233 to completely cover the surface of the conductive layer; accordingly, the upper electrode and an auxiliary wiring are electrically connected to each other easily, which is preferable.

<Examples of Materials>

Next, materials and the like that can be used for a display panel of one embodiment of the present invention will be described. Note that description on the components already described in this embodiment will be omitted.

The element layer 1101 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 1101 may further include a transistor for driving the light-emitting element, a touch sensor, or the like.

The structure of the transistors in the display panel is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The light-emitting element included in the display panel includes a pair of electrodes (the lower electrode 1231 and the upper electrode 1235); and the EL layer 1233 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium: or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

Each of the electrodes may be formed by an evaporation method or a sputtering method. Alternatively, a discharging method such as an ink-jet method, a printing method such as a screen printing method, or a plating method may be used.

When a voltage higher than the threshold voltage of the light-emitting element is applied between the lower electrode 1231 and the upper electrode 1235, holes are injected to the EL layer 1233 from the anode side and electrons are injected to the EL layer 1233 from the cathode side. The injected electrons and holes are recombined in the EL layer 1233 and a light-emitting substance contained in the EL layer 1233 emits light.

The EL layer 1233 includes at least a light-emitting layer. In addition to the light-emitting layer, the EL layer 1233 may further include one or more layers containing any of a material with a high hole-injection property, a material with a high hole-transport property, a hole-blocking material, a material with a high electron-transport property, a material with a high electron-injection property, a material with a bipolar property (a material with a high electron- and hole-transport property), and the like.

For the EL layer 1233, either a low molecular compound or a high molecular compound can be used, and an inorganic compound may also be contained. Each of the above-described layers included in the EL layer 1233 can be formed by any of the following methods: an evaporation method (including a vacuum evaporation method), a transfer method, a printing method, an inkjet method, a coating method, and the like.

In the element layer 1101, the light-emitting element is preferably provided between a pair of insulating films with low water permeability. Thus, an impurity such as water can be prevented from entering the light-emitting element, preventing a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film or the like can be used.

For example, the water vapor transmittance of the insulating film with low water permeability is lower than or equal to $1\times10^{-5}$ [g/m$^2$·day], preferably lower than or equal to $1\times10^{-6}$ [μm$^2$·day], further preferably lower than or equal to $1\times10^{-7}$[g/m$^2$·day], still further preferably lower than or equal to $1\times10^{-8}$ [g/m$^2$·day].

The substrate 1103 has a light-transmitting property and transmits at least light emitted from the light-emitting element included in the element layer 1101. The substrate 1103 may be a flexible substrate. Moreover, the refractive index of the substrate 1103 is higher than that of the air.

An organic resin, which is lighter than glass, is preferably used for the substrate 1103, in which case the light-emitting device can be lightweight as compared with the case where glass is used.

Examples of a material having flexibility and a light-transmitting property with respect to visible light include a glass material that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 1103 may have a stacked structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials. Furthermore, to suppress a decrease in the lifetime of the light-emitting element due to moisture and the like, the insulating film with low water permeability may be included in the stacked structure.

The bonding layer 1105 has a light-transmitting property and transmits at least light emitted from the light-emitting element included in the element layer 1101. The refractive index of the bonding layer 1105 is higher than that of the air.

For the bonding layer 1105, a resin that is curable at room temperature such as a two-component type resin, a light-curable resin, a heat-curable resin, or the like can be used. The examples include an epoxy resin, an acrylic resin, a silicone resin, a phenol resin, and the like. In particular, a material with low moisture permeability, such as an epoxy resin, is preferred.

Further, the resin may include a drying agent. For example, a substance which absorbs moisture by chemical adsorption, such as an oxide of an alkaline-earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The bonding layer 1105 may also include a scattering member for scattering light. For example, the bonding layer 1105 can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

The insulating layer 1205 and the insulating layer 1255 can each be formed using an inorganic insulating material. It is particularly preferable to use the insulating film with low water permeability, in which case a highly reliable display panel can be provided.

The insulating layer 1207 has an effect of preventing diffusion of impurities into a semiconductor included in the transistor. As the insulating layers 1207, an inorganic insulating film such as a silicon oxide film, a silicon oxynitride film, or an aluminum oxide film can be used.

As each of the insulating layers 1209, 1209a, and 1209b, an insulating film with a planarization function is preferably selected in order to reduce surface unevenness due to the transistor or the like. For example, an organic material such as a polyimide resin, an acrylic resin, or a benzocyclobutene-based resin can be used. As an alternative to such an organic material, a low-dielectric constant material (a low-k material) or the like can be used. Note that a plurality of insulating films formed of these materials or inorganic insulating films may be stacked.

The insulating layer 1211 is provided to cover an end portion of the lower electrode 1231. In order that the insulating layer 1211 be favorably covered with the EL layer 1233 and the upper electrode 1235 formed thereover, a side wall of the insulating layer 1211 preferably has a tilted surface with continuous curvature.

As a material for the insulating layer 1211, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 1211.

There is no particular limitation on the method for forming the insulating layer 1211: a photolithography method, a sputtering method, an evaporation method, a droplet discharging method (e.g., an inkjet method), a printing method (e.g., a screen printing method or an off-set printing method), or the like may be used.

The insulating layer 1217 can be formed using an inorganic insulating material, an organic insulating material, a metal material, or the like. As the organic insulating material, for example, a negative or positive photosensitive resin, a non-photosensitive resin, or the like can be used. As the metal material, titanium, aluminum, or the like can be used. When a conductive material is used for the insulating layer 1217 and the insulating layer 1217 is electrically connected to the upper electrode 1235, voltage drop due to the resistance of the upper electrode 1235 can be prevented. The insulating layer 1217 may have either a tapered shape or an inverse tapered shape.

Each of the insulating layers 1276, 1278, 1291, 1293, and 1295 can be formed using an inorganic insulating material or an organic insulating material. It is particularly preferable to use an insulating film with a planarization function for each of the insulating layers 1278 and 1295 in order to reduce surface unevenness due to a sensor element.

For the sealing layer 1213, a resin that is curable at room temperature such as a two-component type resin, a light-curable resin, a heat-curable resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 1213. In the case where light emitted from the light-emitting element 1230 is extracted outside through the sealing layer 1213, the sealing layer 1213 preferably includes a filler with a high refractive index or a scattering member. Materials for the drying agent, the filler with a high refractive index, and the scattering member are similar to those that can be used for the bonding layer 1105.

Each of the conductive layers 1156, 1157, 1294, and 1296 can be formed using the same material and the same step as a conductive layer included in the transistor or the light-emitting element. The conductive layer 1280 can be formed using the same material and the same step as a conductive layer included in the transistor.

For example, each of the conductive layers can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO). ITO, indium zinc oxide (e.g., $In_2O_3$—ZnO), or any of these metal oxide materials in which silicon oxide is contained can be used.

Each of the conductive layers 1208, 1212, 1310a, and 1310b can also be formed using any of the above metal materials, alloy materials, and conductive metal oxides.

Each of the conductive layers 1272, 1274, 1281, and 1283 is a conductive layer with a light-transmitting property. Each of them can be formed using, for example, indium oxide, ITO, indium zinc oxide, zinc oxide, zinc oxide to which gallium is added, or the like. The conductive layer 1270 can be formed using the same material and the same step as the conductive layer 1272.

As the conductive particles 1292, particles of an organic resin, silica, or the like coated with a metal material are used. It is preferable to use nickel or gold as the metal material because contact resistance can be decreased. It is also preferable to use particles each coated with layers of two or more kinds of metal materials, such as particles coated with nickel and further with gold.

For the connector 1215, it is possible to use a paste-like or sheet-like material in which a thermosetting resin is mixed with metal particles and which exhibits anisotropic electric conductivity is provided by thermocompression bonding. As the metal particles, particles in which two or more kinds of metals are layered, for example, nickel particles coated with gold are preferably used.

The coloring layer 1259 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 1257 is provided between the adjacent coloring layers 1259. The light-blocking layer 1257 blocks light emitted from the adjacent light-emitting element, thereby preventing color mixture between adjacent pixels. Here, the coloring layer 1259 is provided such that its end portion overlaps with the light-blocking layer 1257, whereby light leakage can be reduced. The light-blocking layer 1257 can be formed using a material that blocks light emitted from the light-emitting element, for example, a metal material, a resin material including a pigment or a dye, or the like. Note that the light-blocking layer 1257 is preferably provided in a region other than the light extraction portion 1104, such as the driver circuit portion 1106, as illustrated in FIG. 7A, in which case undesired leakage of guided light or the like can be prevented.

The insulating layer 1261 covering the coloring layer 1259 and the light-blocking layer 1257 is preferably provided because it can prevent an impurity such as a pigment included in the coloring layer 1259 or the light-blocking layer 1257 from diffusing into the light-emitting element or the like. For the insulating layer 1261, a light-transmitting material is used, and an inorganic insulating material or an organic insulating material can be used. The insulating film with low water permeability may be used for the insulating layer 1261.

<Manufacturing Method Example>

Next, an example of a method for manufacturing a display panel will be described with reference to FIGS. 11A to 11C and FIGS. 12A to 12C. Here, the manufacturing method is described using the display panel of Specific Example 1 (FIG. 7B) as an example.

Figure 11A:
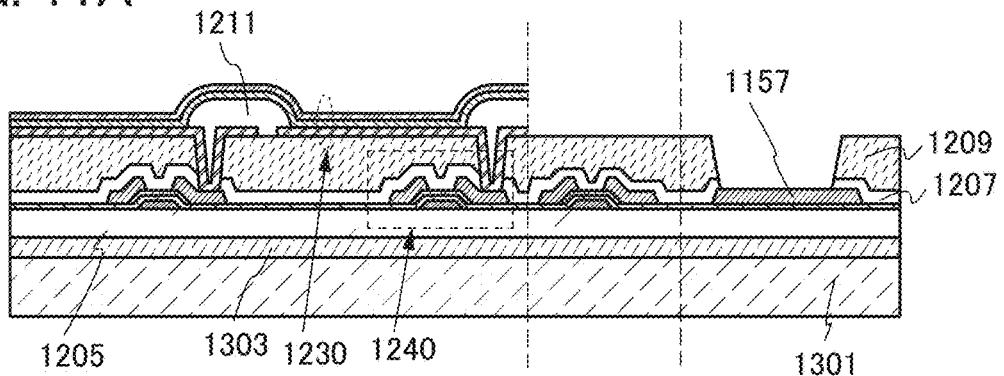
FIGS. 11A to 11C illustrate a method for manufacturing a display panel.

First, a separation layer 1303 is formed over a formation substrate 1301, and the insulating layer 1205 is formed over the separation layer 1303. Then, the plurality of transistors, the conductive layer 1157, the insulating layer 1207, the insulating layer 1209, the plurality of light-emitting elements, and the insulating layer 1211 are formed over the insulating layer 1205. An opening is formed in the insulating layers 1211, 1209, and 1207 to expose the conductive layer 1157 (FIG. 11A).

Figure 11B:
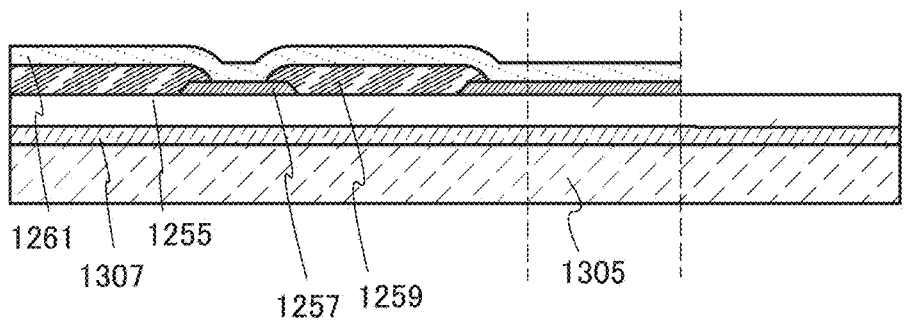

A separation layer 1307 is formed over a formation substrate 1305, and the insulating layer 1255 is formed over the separation layer 1307. Then, the light-blocking layer 1257, the coloring layer 1259, and the insulating layer 1261 are formed over the insulating layer 1255 (FIG. 11B).

The formation substrate 1301 and the formation substrate 1305 can each be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. In the case where the temperature of heat treatment to be performed later is high, a substrate having a strain point of 730° C. or higher may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 1303 and the separation layer 1307 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be any of amorphous, microcrystal, and polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Each of the insulating layers can be formed by a sputtering method, a plasma CVD method, a coating method, a printing method, or the like. For example, the insulating layer is formed at a temperature of higher than or equal to 250° C. and lower than or equal to 400° C. by a plasma CVD method, whereby the insulating layer can be a dense film with very low water permeability.

Figure 11C:
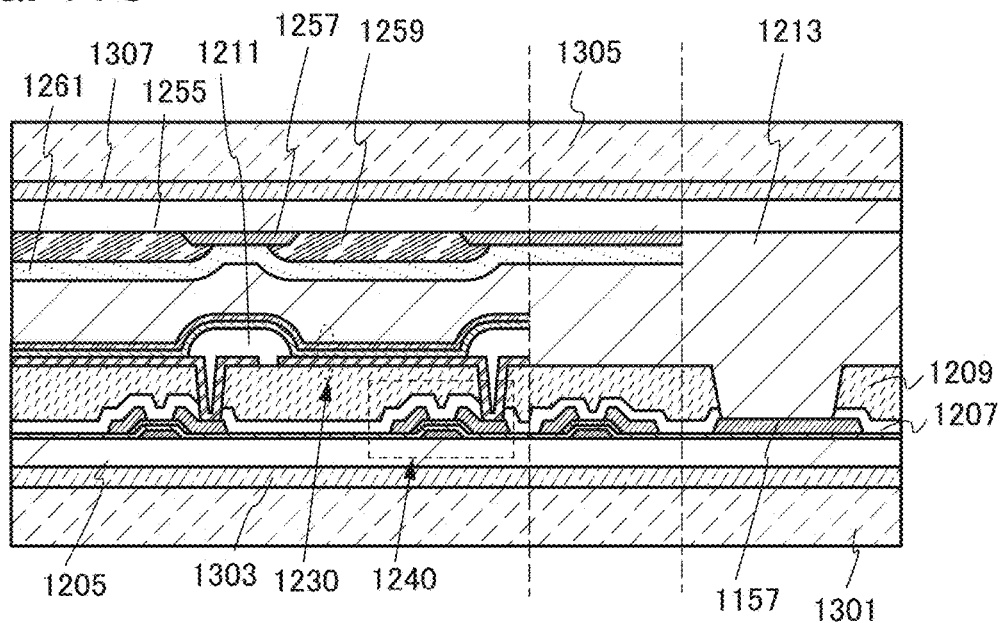

Then, a material for the sealing layer 1213 is applied to a surface of the formation substrate 1305 over which the coloring layer 1259 and the like are formed or a surface of the formation substrate 1301 over which the light-emitting element 1230 and the like are formed, and the formation substrate 1301 and the formation substrate 1305 are attached so that these two surfaces face each other with the sealing layer 1213 positioned therebetween (FIG. 11C).

Next, the formation substrate 1301 is separated, and the exposed insulating layer 1205 and the substrate 1201 are attached to each other with the use of the bonding layer 1203. Furthermore, the formation substrate 1305 is separated, and the exposed insulating layer 1255 and the substrate 1103 are attached to each other with the use of the bonding layer 1105. Although the substrate 1103 does not overlap with the conductive layer 1157 in FIG. 12A, the substrate 1103 may overlap with the conductive layer 1157.

Any of a variety of methods can be used as appropriate for the separation process. For example, when a layer including a metal oxide film is formed as the separation layer so as to be in contact with the layer to be separated, the metal oxide film is embrittled by crystallization, whereby the layer to be separated can be separated from the formation substrate. Alternatively, when an amorphous silicon film containing hydrogen is formed as the separation layer between a formation substrate having high heat resistance and a layer to be separated, the amorphous silicon film is removed by laser light irradiation or etching, whereby the layer to be separated can be separated from the formation substrate. Alternatively, after a layer including a metal oxide film in contact with the layer to be separated is formed, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Alternatively, a method carried out as follows may be employed: a film containing nitrogen, oxygen, hydrogen, or the like (e.g., an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

When a plurality of the above-described separation methods is combined, the separation process can be conducted easily. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other.

Separation of the layer to be separated from the formation substrate may be carried out by soaking the interface between the separation layer and the layer to be separated in a liquid. Furthermore, the separation may be conducted while a liquid such as water is being poured.

As another separation method, in the case where the separation layer is formed using tungsten, it is preferable that the separation be performed while etching the separation layer using a mixed solution of ammonium water and a hydrogen peroxide solution.

Note that the separation layer is not necessarily provided in the case where separation at an interface between the formation substrate and the layer to be separated is possible. For example, glass is used as the formation substrate, an organic resin such as polyimide is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 12A:
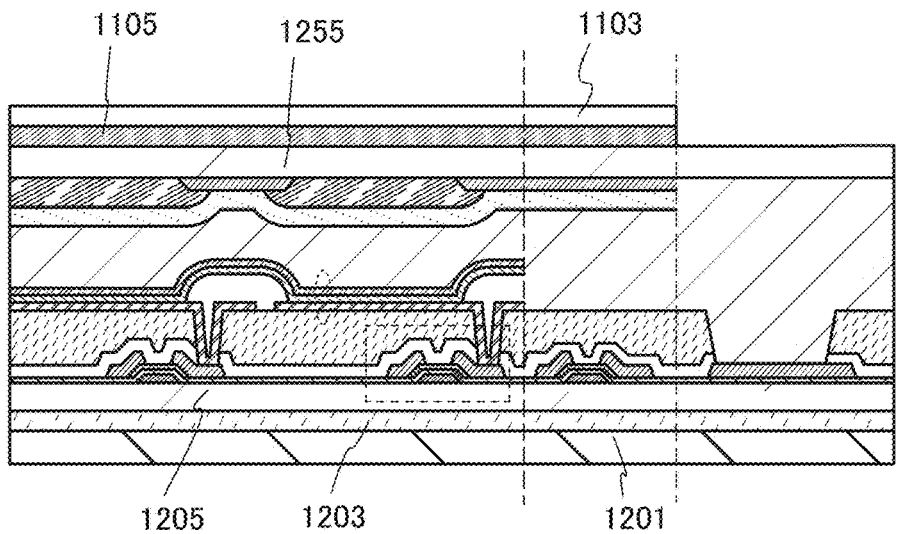
FIGS. 12A to 12C illustrate a method for manufacturing a display panel.
Figure 12B:
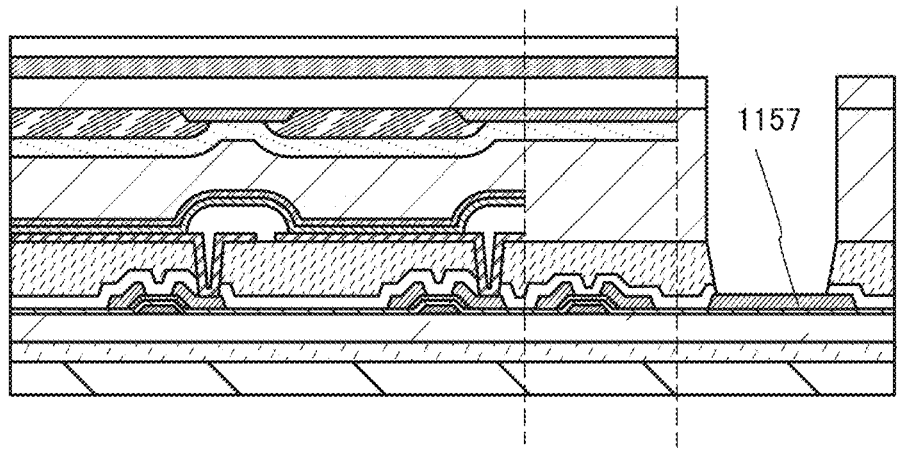
Figure 12C:
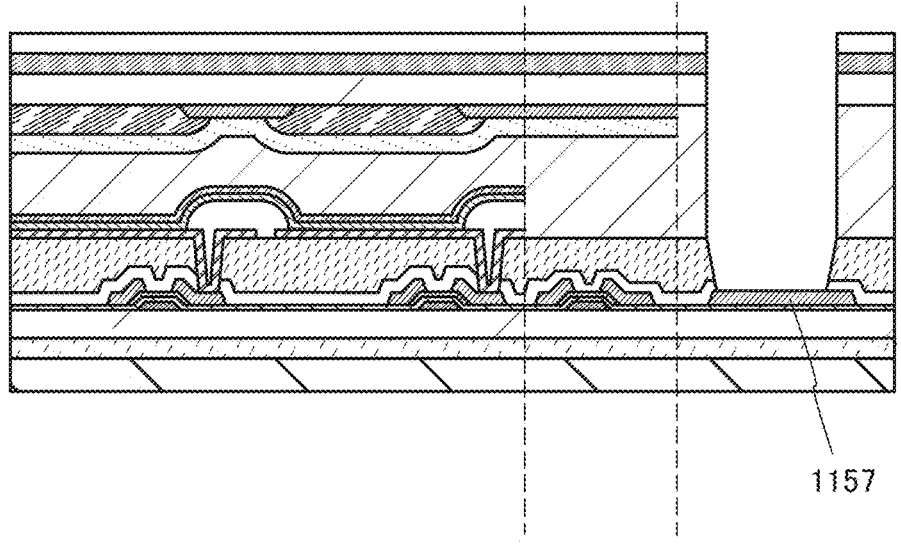

Lastly, an opening is formed in the insulating layer 1255 and the sealing layer 1213 to expose the conductive layer 1157 (FIG. 12B). In the case where the substrate 1103 overlaps with the conductive layer 1157, the opening is formed also in the substrate 1103 and the bonding layer 1105 (FIG. 12C). The method for forming the opening is not particularly limited and may be, for example, a laser ablation method, an etching method, an ion beam sputtering method, or the like. As another method, a cut may be made in a film over the conductive layer 1157 with a sharp knife or the like and part of the film may be separated by physical force.

In the above-described manner, the display panel of one embodiment of the present invention can be manufactured.

As described above, the display panel of this embodiment includes two substrates; one is the substrate 1103 and the other is the substrate 1201 or the substrate 1202. The display panel can be formed with two substrates even when including a touch sensor. Owing to the use of the minimum number of substrates, improvement in light extraction efficiency and improvement in clarity of display can be easily achieved.

This embodiment can be combined with any of the other embodiments as appropriate.

Embodiment 5

In this embodiment, examples of an electronic device using the display device of one embodiment of the present invention will be described with reference to drawings.

As examples of electronic devices using a flexible display device, the following can be given: television devices (also called televisions or television receivers), monitors of computers or the like, digital cameras, digital video cameras, digital photo frames, mobile phones (also called cellular phones or mobile phone devices), portable game machines, portable information terminals, audio reproducing devices, large game machines, and the like.

Figure 13A:
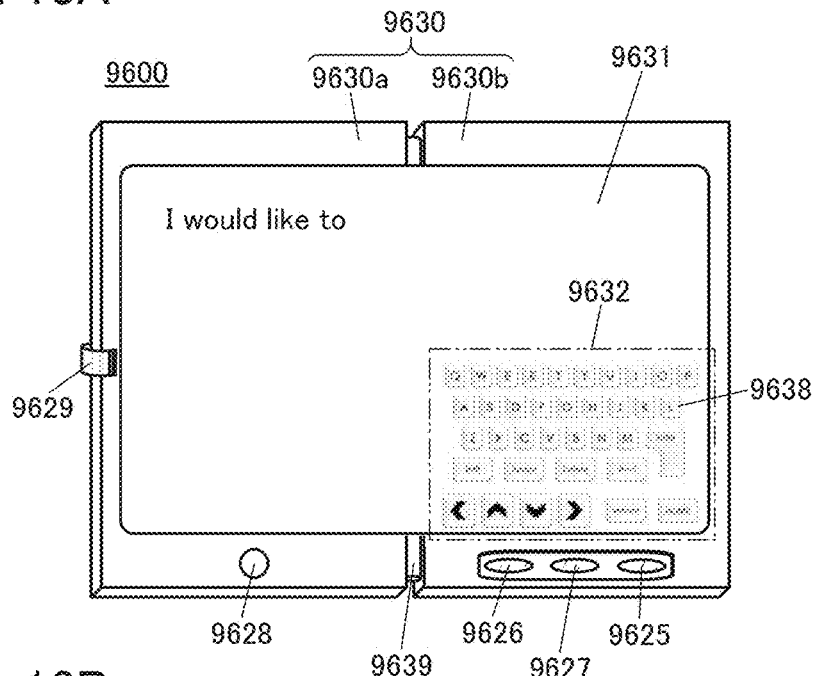
FIGS. 13A to 13C illustrate an example of an electronic device.
Figure 13B:
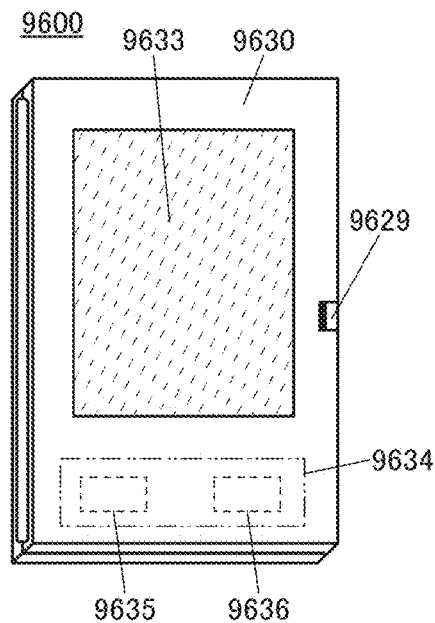

FIGS. 13A and 13B illustrate a tablet terminal 9600 which can be folded in two. Note that, although an example in which the tablet terminal can be folded in two is shown here, a tablet terminal that can be folded in three, four, or more can also be fabricated. In FIG. 13A, the tablet terminal 9600 is opened, and includes a housing 9630, a display portion 9631, a switch 9626 for switching display modes, a power switch 9627, a switch 9625 for switching to power-saving mode, a fastener 9629, and an operation switch 9628.

The housing 9630 includes a housing 9630a and a housing 9630b, which are connected to each other with a hinge portion 9639. The housing 9630 can be folded in two by the hinge portion 9639.

A display portion 9631 is formed over the housing 9630a, the housing 9630b, and the hinge portion 9639. With the use of the flexible display panel disclosed in this specification and the like for the display portion 9631, a highly reliable tablet terminal with the display portion 9631 that is foldable can be obtained.

Part of the display portion 9631 can be a touchscreen region 9632 and data can be input when a displayed operation key panel 9638 is touched. The display portion 9631 may have a structure in which a half of the area has only a display function and the other half of the area has a touch panel function. Alternatively, all the area of the display portion 9631 may have a touch panel function. For example, keyboard buttons may be displayed on all the area of the display portion 9631 so that the tablet terminal is used as a data input terminal.

The switch 9626 for switching a display mode allows switching between a landscape mode and a portrait mode, switching between color display and black-and-white display, and the like. The switch 9625 for switching to power-saving mode can control display luminance to be optimal in accordance with the amount of external light in use of the tablet terminal which is detected by an optical sensor incorporated in the tablet terminal. In addition to the optical sensor, other sensing devices such as sensors for determining inclination, such as a gyroscope or an acceleration sensor, may be incorporated in the tablet terminal.

In FIG. 13B, the tablet terminal 9600 is folded, and includes the housing 9630, a solar battery 9633, and a charge and discharge control circuit 9634. Note that FIG. 13B shows an example in which the charge and discharge control circuit 9634 includes a battery 9635 and a DCDC converter 9636.

With the use of the display device disclosed in this specification and the like for the display portion 9631, the display portion 9631 becomes foldable. For example, since the tablet terminal 9600 can be folded in two, the housing 9630 can be closed when the tablet terminal is not used. Therefore, the tablet terminal is excellent in portability, and excellent in durability since the display portion 9631 can be protected when the housing 9630 is closed; accordingly, the tablet terminal is excellent in reliability in the light of long-term use.

The tablet terminal illustrated in FIGS. 13A and 13B can have other functions such as a function of displaying a variety of kinds of data (e.g., a still image, a moving image, and a text image), a function of displaying a calendar, a date, the time, or the like on the display portion, a touch-input function of operating or editing the data displayed on the display portion by touch input, and a function of controlling processing by a variety of kinds of software (programs).

The solar battery 9633, which is attached on the surface of the tablet terminal, can supply electric power to the touch panel, the display portion, an image signal processor, and the like. Note that the solar battery 9633 can be provided on one or both surfaces of the housing 9630, so that the battery 9635 can be charged efficiently. When a lithium ion battery is used as the battery 9635, there is an advantage of downsizing or the like.

Figure 13C:
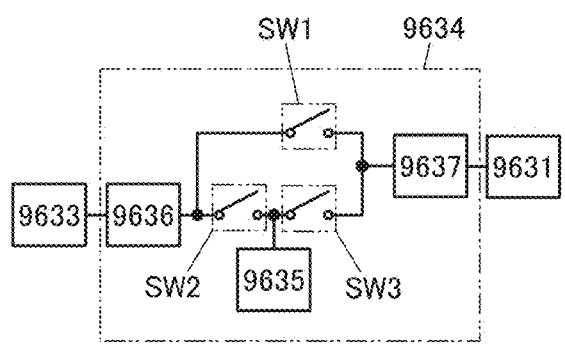

The structure and operation of the charge and discharge control circuit 9634 illustrated in FIG. 13B are described with reference to a block diagram of FIG. 13C. FIG. 13C shows the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 13B.

First, an example of operation in the case where power is generated by the solar battery 9633 using external light is described. The voltage of power generated by the solar cell is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means: however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

It is needless to say that one embodiment of the present invention is not limited to the above-described electronic devices as long as the display device of one embodiment of the present invention is incorporated.

This embodiment can be implemented in an appropriate combination with any of the structures described in the other embodiments.

REFERENCE NUMERALS

101: flexible display panel, 102-1: flexible substrate, 102-2: flexible substrate, 111-1: housing, 111-2: frame member, 112-1: housing, 112-2: frame member, 113-1: housing, 113-2: frame member, 121: battery unit, 122: control unit, 125: FPC, 128: side frame member, 130: wiring, 132: opening, 133: opening, 134: wiring. 1212: conductive layer, 1271: p-type semiconductor layer. 1273: i-type semiconductor layer, 1275: n-type semiconductor layer, 1280: conductive layer. 600: main substrate, 601: speaker. 602: camera. 603: display panel, 604: battery unit, 605: antenna for portable communication, 606: antenna for NFC. 611: quartz crystal unit, 612: DRAM, 613: application processor, 614: baseband processor, 615: electronic compass, 616: quartz crystal unit, 617: RF transceiver IC, 618: touch panel control IC, 619: acceleration sensor, 620: module, 621: power supply control IC, 622: power amplifier for W-CDMA, 623: flash memory, 624: filter, 1101: element layer, 1103: substrate, 1104: light extraction portion, 1105: bonding layer, 1106: driver circuit portion. 1108: FPC, 1108a: FPC, 1108b: FPC. 1156: conductive layer 1157: conductive layer, 1201: substrate, 1202: substrate, 1203: bonding layer, 1205: insulating layer, 1207: insulating layer, 1208: conductive layer, 1209: insulating layer, 1209a: insulating layer, 1209b: insulating layer, 1211: insulating layer, 1213: sealing layer; 1215: connector, 1215a: connector, 1215b: connector, 1217: insulating layer, 1230: light-emitting element, 1231: lower electrode, 1233: EL layer, 1235: upper electrode, 1240: transistor, 1255: insulating layer, 1257: light-blocking layer, 1259: coloring layer. 1261: insulating layer, 1270: conductive layer, 1272: conductive layer, 1274: conductive layer, 1276: insulating layer, 1278: insulating layer, 1281: conductive layer. 1283: conductive layer, 1291: insulating layer, 1292: conductive particle, 1293: insulating layer, 1294: conductive layer, 1295: insulating layer, 1296: conductive layer, 1301: formation substrate, 1303: separation layer, 1305: formation substrate, 1307: separation layer, 1310a: conductive layer. 1310b: conductive layer, 9600: tablet terminal, 9625: switch, 9626: switch, 9627: power switch, 9628: operation switch, 9629: fastener, 9630: housing. 9631: display portion, 9632: region, 9633: solar battery. 9634: charge and discharge control circuit, 9635: battery, 9636: DCDC converter, 9637: converter, 9638: operation key, 9639: hinge portion, 9630a: housing, 9630b: housing This application is based on Japanese Patent Application serial no. 2013-179069 filed with Japan Patent Office on Aug. 30, 2013, the entire contents of which are hereby incorporated by reference.

The invention claimed is:

1. A display device comprising:
 a flexible display panel;
 a first housing supporting a first portion of the flexible display panel;
 a second housing supporting a second portion of the flexible display panel;
 a first battery unit in the first housing;
 a second battery unit in the second housing;
 a control unit in the second housing, the control unit being configured to control the display device; and
 a wiring,
 wherein the first battery unit and the control unit are electrically connected with each other through the wiring,
 wherein the flexible display panel comprises a bend portion between the first housing and the second housing, and the first housing and the second housing overlap with each other when the flexible display panel is folded, and
 wherein the wiring is provided inside the flexible display panel or in contact with and along a surface of the flexible display panel.

2. The display device according to claim 1, wherein the flexible display panel is an active matrix light-emitting device.

3. The display device according to claim 1, wherein the flexible display panel is a liquid crystal display device.

4. The display device according to claim 1, further comprising a flexible substrate between the flexible display panel and each of the first housing and the second housing.

5. The display device according to claim 1, wherein at least one of the first battery unit and the second battery unit is charged with a non-contact power transmission module.

6. A display device comprising:
a flexible display panel;
a first housing supporting a first portion of the flexible display panel;
a second housing supporting a second portion of the flexible display panel;
a third housing supporting a third portion of the flexible display panel;
a first battery unit in the first housing;
a second battery unit in the second housing;
a circuit in the third housing; and
a wiring,
wherein the second portion is positioned between the first portion and the third portion,
wherein the flexible display panel is electrically connected to the circuit through the wiring,
wherein the flexible display panel comprises a first bend portion between the first housing and the second housing and a second bend portion between the second housing and the third housing,
wherein the first to third housings overlap with one another when the flexible display panel is folded by bending the first bend portion and the second bend portion, and
wherein the wiring is provided inside the flexible display panel or in contact with and along a surface of the flexible display panel.

7. The display device according to claim 6, wherein the flexible display panel is an active matrix light-emitting device.

8. The display device according to claim 6, wherein the flexible display panel is a liquid crystal display device.

9. The display device according to claim 6, further comprising a flexible substrate between the flexible display panel and each of the first housing, the second housing, and the third housing.

10. The display device according to claim 6, wherein at least one of the first battery unit and the second battery unit is charged with a non-contact power transmission module.

11. A display device comprising:
a flexible display panel;
a first housing supporting a first portion of the flexible display panel;
a second housing supporting a second portion of the flexible display panel;
a battery unit in the first housing;
a control unit in the second housing, the control unit configured to control the display device; and
a wiring,
wherein the battery unit and the control unit are electrically connected with each other through the wiring,
wherein the flexible display panel comprises a bend portion between the first housing and the second housing, and the first housing and the second housing overlap with each other when the flexible display panel is folded, and
wherein the wiring is provided inside the flexible display panel or in contact with and along a surface of the flexible display panel.

12. The display device according to claim 11, wherein the flexible display panel is an active matrix light-emitting device.

13. The display device according to claim 11, wherein the flexible display panel is a liquid crystal display device.

14. The display device according to claim 11, further comprising a flexible substrate between the flexible display panel and each of the first housing and the second housing.

15. The display device according to claim 11, wherein the battery unit is charged with a non-contact power transmission module.

* * * * *